United States Patent
Abbott et al.

(10) Patent No.: US 6,288,392 B1
(45) Date of Patent: Sep. 11, 2001

(54) QUANTITATIVE CHARACTERIZATION OF OBLIQUELY-DEPOSITED SUBSTRATES OF GOLD BY ATOMIC FORCE MICROSCOPY: INFLUENCE OF SUBSTRATE TOPOGRAPHY ON ANCHORING OF LIQUID CRYSTALS

(75) Inventors: Nicholas L. Abbott, Madison, WI (US); Justin J. Skaife, Lafayette, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/233,293

(22) Filed: Jan. 19, 1999

(51) Int. Cl.[7] ................................... H01J 37/00
(52) U.S. Cl. ............................................. 250/307
(58) Field of Search .............................. 250/307, 306

(56) References Cited

U.S. PATENT DOCUMENTS 6,180,288 * 1/2001 Everhart et al. ..................... 430/2

OTHER PUBLICATIONS

Barberi et al., "AFM experimental observation and fractal characterization of an SiO–coated plate for nematic bistable anchoring" *J. Phys. Condens. Matt.* 6:A275–A278 (1994).
Barberi et al., "Planar nematic anchoring on rough anistropic susbtrates: an elastic model" *Phys. Lett. A* 213:293–296 (1996).
Berreman, D.W., "Alignment of Liquid Crystals by Grooved Surfaces" *Mol. Crys. & Liq. Crys.* 23:215–231 (1973).
Berreman, D.W., "Solid Surface Shape and the Alignment of an Adjacent Nematic Liquid Crystal" *Phy. Rev. Lett.* 26:28, 1683–1686 (1972).
Blinov et al., "Curvature oscillations and linear electo–optical effect in a surface layer of a nematic liquid crystal" *J. Phys. II France* 2:1287–1297 (1992).
Bodammer et al., "Scanning probe microscope study of obliquely evaporated SiOx and its indium–tin–oxide underlayer for the alignment of ferroelectric liquid crystals" *SPIE* 2731:95–99 (1995).
Goodman, et al., "Topography of Obliquely Evaporated Silicon Oxide Films and Its Effect on Liquid–Crystal Orientation" *IEEE Trans. Elect. Dev.,* ED–24(7): 795–804 (1977).

(List continued on next page.)

*Primary Examiner*—Kiet T. Nguyen
(74) *Attorney, Agent, or Firm*—Townsend and Townsend and Crew LLP

(57) ABSTRACT

Scanning probe microscopy is used to quantitatively characterize structural anisotropy within obliquely deposited metal films. Whereas visual inspection of AFM images (real space or reciprocal space) reveals no obvious structural anisotropy within these gold films, by quantitative analysis of the AFM profiles, subtle structural anisotropy is observed. The quantitative characterization provides a method to estimate the influence of anisotropy on the orientations of supported mesogenic layers.

51 Claims, 9 Drawing Sheets

OTHER PUBLICATIONS

Gupta et al., "Uniform Anchoring of Nematic Liquid Crystals on Self–Assembled Monolayers formed from Alkanethiols on Obliquely Deposited Films of Gold" *Langmuir* 12:2587–2593 (1996).

Jerome, B., "Surface effects and anchoring in liquid crystals" *Rep. Prog. Phys.* 54:391–451 (1991).

Mbise, et al., "High resolution studies of columnar growth in obliquely deposited metal films on glass" *Thin Solid Films* 173(2):L123–L127 (1989).

Tait, et al., "Structural anistrophy in oblique incidence thin metal films" *J. Vac. Sci. Tech. A* 10(4):1518–1521 (1992).

van Kranenburg, et al., "Tailoring growth and local composition by oblique–incidence deposition: a review and new experimental data" *Mat. Sci. & Engr.* R11(7):295–354 (1994).

Vernier et al., "How is the fractal dimension of a thin film top surface connected with the roughness parameters and anistrophy of this surface?" *J. Vac. Sci. Tech. A.* 9:(3):563–569 (1991).

Wolff, et al., "The Homogeneous Alignment of Liquid Crystal Layers" *Mol. Crys. & Liq. Crys.* 23:187–196 (1973).

* cited by examiner

C16 SAM on obliquely deposited gold.
400 nm x 400 nm Image.
Contact AFM.

QUANTITATIVE CHARACTERIZATION OF OBLIQUELY-DEPOSITED SUBSTRATES OF GOLD BY ATOMIC FORCE MICROSCOPY: INFLUENCE OF SUBSTRATE TOPOGRAPHY ON ANCHORING OF LIQUID CRYSTALS

STATEMENT AS TO RIGHTS TO INVENTIONS MADE UNDER FEDERALLY SPONSORED RESEARCH OR DEVELOPMENT

This invention was made with Government support under Grant No. CTS9502263 and No. DMR9400354, awarded by National Science Foundation and Grant No. N00014-97-1-0703 awarded by the Office of Naval Research. The Government has certain rights in this invention.

BACKGROUND OF THE INVENTION

Investigations into the anchoring of liquid crystals (LCs) on self-assembled monolayers (SAMS) formed from ω-functionalized alkanethiols supported on films of gold deposited obliquely onto glass substrates has recently been reported (Gupta et al., Langmuir 10: 12, 2587 (1996); Gupta et al., Chem. Mater. 8: 1366 (1996)). This system is a useful one because, with relative ease, it is possible to design and synthesize surfaces that differ in structure and presentation of functional groups, and thus explore the influence of the structure of surfaces on the orientations of supported LCs (Gupta et al., Langmuir 10: 12, 2587 (1996); Gupta et al., Chem. Mater. 8: 1366 (1996); Gupta et al., Science 279: 2077 (1998)). For example, by hosting recognition moieties that recognize particular analytes within SAMs, it is possible to amplify and transduce the interaction between the recognition moiety and the analyte on these surfaces into optical signals through the orientations of birefringent LCs placed on these surfaces See, U.S. patent application Ser. No. 09/127,383, filed Jul. 31, 1998 entitled "Optical Amplification of Molecular Interaction Using Liquid Crystals." This approach makes possible detection of the interactions of analytes with surfaces (e.g., antibody-antigen interactions) with relatively simple procedures involving LCs and visual inspection.

Past studies of SAMs on metals have focused on the use of single crystals of metal (Strong et al., Langmuir 4: 546 (1988); Widrig et al., J. Am. Chem. Soc. 113: 2805 (1991)), metals deposited by electroless methods (Hou, et al., Langmuir 14: 3287 (1998), or evaporated films of metal deposited without a preferred direction (Gupta et al., Chem. Mater. 8: 1366 (1996); Drawhom et al., J. Phys. Chem. 45: 99, 16511 (1995)) (FIG. 1A).

Recent work dealing with LCs has relied on the use of gold films deposited at an oblique angle of incidence with respect to a substrate of glass (Gupta et al., Langmuir 10: 12, 2587 (1996); Gupta et al., Chem. Mater. 8: 1366 (1996) (FIG. 1B). LCs supported on SAMs formed on obliquely deposited gold (100 Å of gold deposited at an angle of 50° from the normal) generally have been observed to assume one of two azimuthal orientations (defined with respect to the plane of incidence of the gold during deposition of the gold film) (Gupta et al., Langmuir 10: 12, 2587 (1996)). For example, nematic phases of 4-cyano-4'-pentylbiphenyl (5CB) supported on SAMs formed from $CH_3(CH_2)_{15}SH$ assume an orientation that is parallel to the surface of the substrate and parallel to the plane of incidence of the gold during deposition of the film of gold. In contrast, nematic phases of 5CB supported on SAMs formed from $CH_3(CH_2)_{14}SH$ assume a bulk orientation that is parallel to the surface of the gold substrate but perpendicular to the plane of incidence of the flux of gold. Certain nanometer-scale structures formed on these surfaces (e.g., protein molecules bound specifically to ligands hosted on these surfaces) can erase the influence of the oblique deposition of the gold on the preferred azimuthal orientations of a supported LC. This fact is exploited in past work dealing with the development of principles for amplification and transduction of ligand-receptor interactions at surfaces (Gupta et al., Science 279: 2077 (1998)).

A number of past studies of obliquely deposited metals and metal oxides have been reported. The films investigated in those studies were thick (>50 nm) and prepared by sputtering, giving rise to large grains, columnar structures, and anisotropy that was easily seen by visual inspection of, for example, SEM or TEM images of cross sections of the films. (Jerome, B., Rep. Prog Phys., 54: 391 (1991); Tait et al., J. Vac. Tech. A. 4: 10, 1518 (1992); van Kranenburg, et al., Mat. Sci. & Engr., 7: R11, 295 (1994); Vernier et al., J. Vac. Sci. Tech. A 3: 9, 563 (1991); Mbise et al., Thin Solid Films 174: L123 (1989); Goodman et al., IEEE Trans. Elec. Dev., 7: ED-24, 795 (1977)). In contrast, thin films of obliquely deposited gold (~30 nm, so as to be semi-transparent), are formed of small grains with characteristic dimensions of <30 nm, and have no obvious anisotropy when images (real or Fourier space) obtained by AFM or STM are inspected visually.

Although studies have demonstrated that obliquely deposited gold films are useful substrates for SAMs when anchoring LCs, the structure of these gold films has not been reported in detail. It is noteworthy that preliminary attempts to characterize the anisotropy within these gold films by visual inspection of scanning tunneling micrographs were largely unsuccessful. See, Gupta et al., Langmuir 12: 2587 (1996).

Surprisingly, the present invention provides experimental procedures and methods of analysis that provide quantitative measures of the anisotropy within obliquely deposited metal films. By the use of scanning probe methods (AFM/STM), it is possible to routinely and reproducibly detect anisotropy within thin, obliquely deposited metal films and organic layers attached to these films. Further, the anisotropy measured can provide an account of the preferred azimuthal orientation of LCs on obliquely deposited metal films.

SUMMARY OF THE INVENTION

It has now been discovered that anisotropy in obliquely deposited metal films can be quantitatively analyzed utilizing scanning probe microscopic techniques such as scanning tunneling microscopy and atomic force microscopy. The methods of the invention allow detection of anisotropy that cannot be detected by visual inspection of micrographs of the metal surface.

Provided herein, are useful tools for characterizing metal films and for predicting the orientations of liquid crystals (LCs) supported on these metal films. Also provided are techniques for understanding and predicting the manner in which the structure of organic layers, such as self-assembled monolayers (SAMs), adsorbed onto the metal films affect the orientations of LCs anchored by the organic layers. Further, methods are provided for predicting changes in the orientation of an LC anchored to an organic layer or a metal film comprising a recognition moiety when that recognition moiety interacts with an analyte. Moreover, methods are provided for designing and/or selecting surfaces that differ systematically in their anisotropy. For example, control of the level of structural anisotropy within these surfaces enables the design of surfaces that permit detection of the binding of analytes at differing threshold concentrations of analyte.

Thus, in a first aspect, the present invention provides a method utilizing scanning probe microscopy for detecting anisotropy of a surface of an obliquely deposited metal film. The method comprises determining a first value representative of a contour length of a cross-sectional profile in a first direction of a scanning probe microscopic image of the metal surface and determining a second value representative of a contour length of a cross-sectional profile in a second direction not parallel to the first direction of the scanning probe microscopic image of the metal surface. Once these values are determined they are compared to each other. On the basis of this comparison, it is possible to ascertain the presence and extent of the anisotropy of a particular surface.

In a second aspect, the present invention provides another method for utilizing scanning probe microscopy for detecting anisotropy of a surface of an obliquely deposited metal film. This second method comprises determining a first value representative of a curvature of a cross-sectional profile in a first direction of a scanning probe microscopic image of the metal surface and determining a second value representative of a curvature of a cross-sectional profile in a second direction not parallel to the first direction of the scanning probe microscopic image of the metal surface. The first value and the second value are compared and the anisotropy is determined based on this comparison.

A third aspect of the present invention provides still another method utilizing scanning probe microscopy for detecting anisotropy of a surface of an obliquely deposited metal film. This method comprises comparing power spectra for a scanning probe microscopic image of the surface. The first power spectrum is obtained for a first direction on the surface. The second power spectrum is derived from a second direction along the surface. The first and second directions are not parallel to each other. By comparing the two power spectra, the anisotropy of the surface can be distinguished.

In a fourth aspect, the present invention also provides a method utilizing scanning probe microscopy for calculating the difference in elastic free energy between a liquid crystal anchored to an obliquely deposited metal surface in a direction parallel to a direction of metal deposition and a liquid crystal anchored to said surface in a direction perpendicular to said direction of metal deposition. The method comprises obtaining amplitude and wavenumber data for an obliquely deposited metal surface in a direction parallel to the direction of metal deposition; calculating the elastic free energy in the parallel direction ($F_0°$) utilizing the amplitude and wavenumber data for the direction parallel to said direction of metal deposition; obtaining amplitude and wavenumber data for the obliquely deposited metal surface in a direction perpendicular to the direction of metal deposition; calculating the elastic free energy in the perpendicular direction ($F_{90}°$) utilizing the amplitude and wavenumber data for the direction perpendicular to the direction of metal deposition to calculate $F_{90}°$; and calculating the difference between $F_{90}°$ and $F_0°$.

In a fifth aspect, the present invention provides a method of selecting an anisotropic surface, the anisotropy causing the surface to respond in a detectable manner at a desired level of response to an analyte that interacts with the surface. The method comprises: (a) obtaining a first power spectrum in a first direction and a second power spectrum in a second direction not parallel to the first direction of one said surface having a first property and characterizing the anisotropy of the surface using the power spectra; and; (b) repeating step (a) at least once on surfaces having a second property, the property selected such that the anisotropy approaches a preselected value that will produce a desired level of response of the surface to the analyte, until the level is achieved.

The invention also provides a method to select a surface that will exhibit desired characteristics. A preferred application of this method is the selection of surfaces that comprise a recognition moiety that interacts with an analyte. In particular, this aspect of the invention allows for the selection of an anisotropic surface that will respond to an incoming analyte in a detectable manner and at a desired level of response. This method comprises obtaining a first power spectrum in a first direction and a second power spectrum in a second direction not parallel to the first direction of one said surface in which the recognition moieties are present in a first density per unit area, the power spectra being obtained without analyte interacting with the recognition moiety. A second set of power spectra are similarly obtained from a surface in which an analyte is interacting with the recognition moiety. The two sets of power spectra are compared to arrive at an estimation of the differences in anisotropy between the two surfaces.

Additional objects and advantages of the present invention will be apparent to those of skill in the art from the detailed description that follows.

(B) The vertical scale bar corresponds to a height of 64 nm (z-scale approximately equal to horizontal scale).

Figure 4:
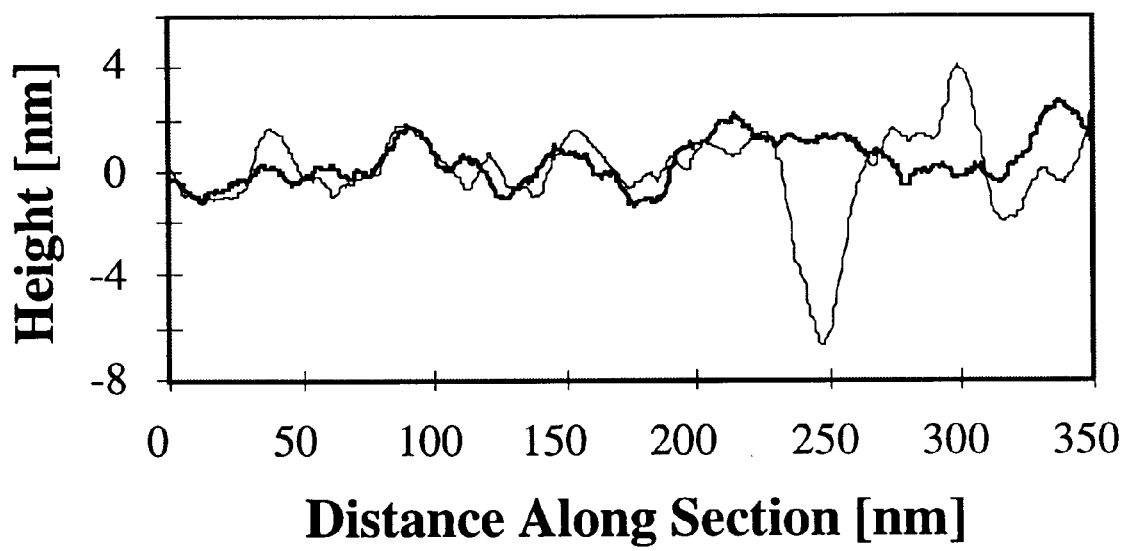

FIG. 4. Cross-sectional profiles taken from the image of the obliquely deposited film of gold shown in FIG. 2A. The white lines in FIG. 2A indicate the location of the cross sectional profiles. The thin line represents the cross-sectional profile measured parallel to direction of deposition of the gold film. The thick line represents the cross-sectional profiles measured perpendicular to the direction of deposition of the gold film.

Figure 5:
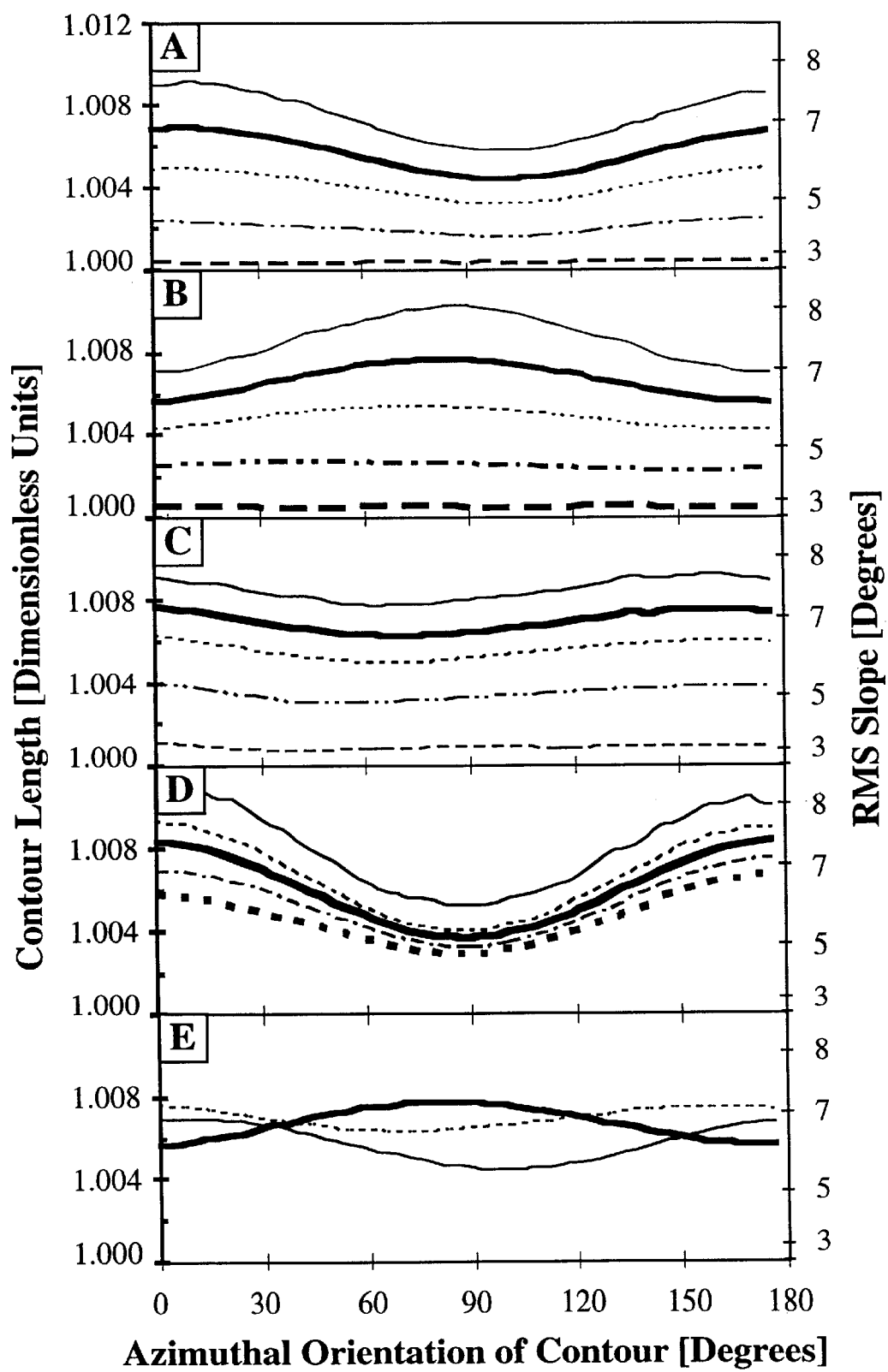

FIG. 5. Contour length analyses of the AFM images of obliquely deposited films of gold shown in FIG. 2. Sampling wavelengths in A–C are: ((——))4 mn, ((——)) 8 nm, ((– – –)) 12 nm, ((– · –)) 20 nm, and ((—)) 40 nm.
  (A) Analysis of image of obliquely deposited film shown in FIG. 2A. An azimuthal orientation of 0° (x-axis) corresponds to a contour oriented parallel to the direction of deposition of the gold film;
  (B) Analysis of image of the obliquely deposited film shown in FIG. 2C. An azimuthal orientation of 0° corresponds to a contour oriented perpendicular to the direction of deposition of the gold film.
  (C) Analysis of image of the uniformly deposited film of golf shown in FIG. 2C. An azimuths orientation of 0° corresponds to a contour oriented parallel to the scan direction.
  (D) Analysis of obliquely deposited film of gold shown in FIG. 2D. An azimuthal orientation of 0° represents a direction that is parallel to the direction of deposition. Sampling wavelengths from top: ((——)) 2 nm ((– –)) 4 mn, ((——)) 6 mn, ((– · –)) 8 nm, and ((—)) 10 nm.
  (E) Comparison of contour lengths measured using a sampling wavelength of 8 nm: ((——)) from A; ((——)) from B; ((– – –)) from C.

Figure 6:
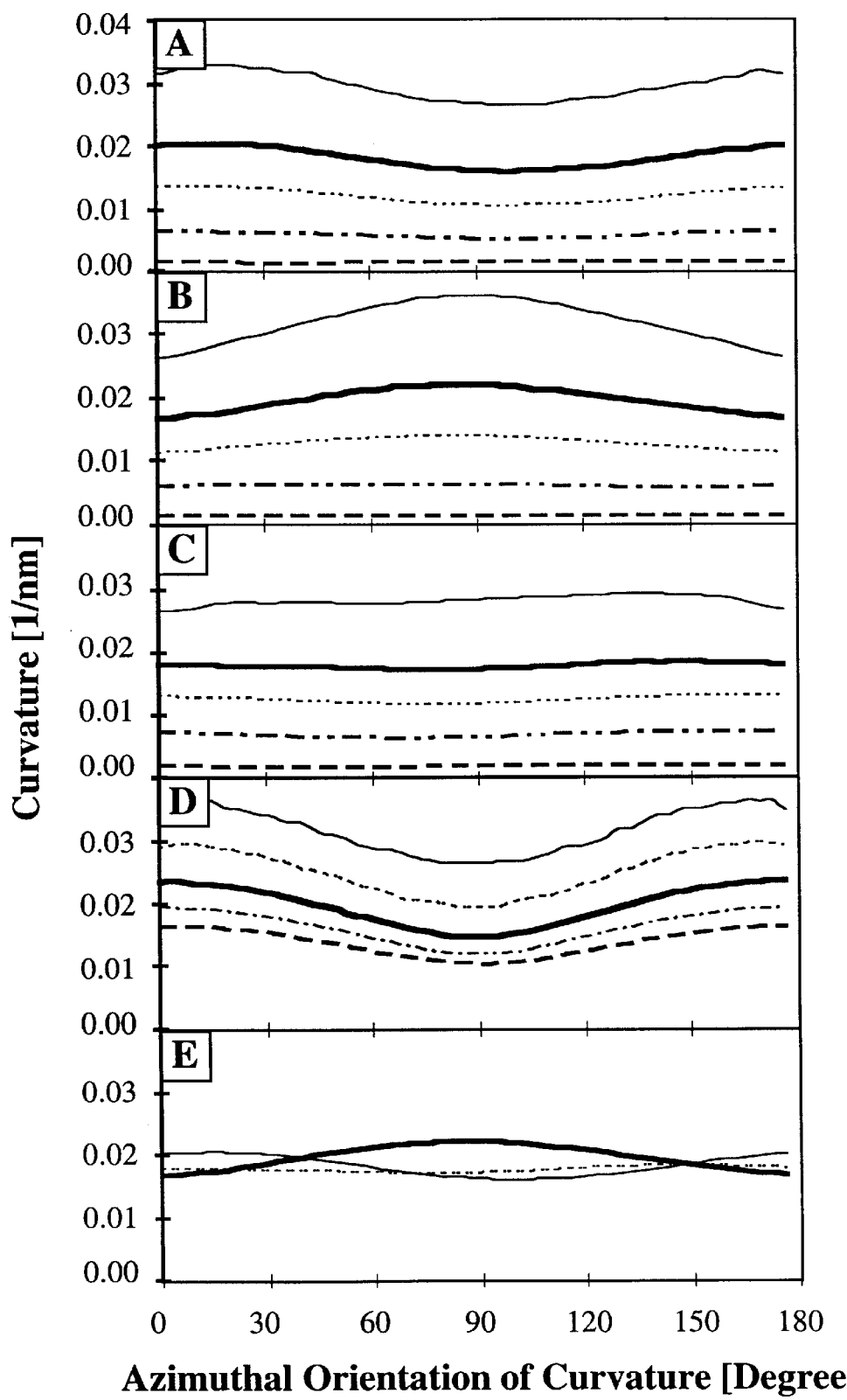

FIG. 6. Curvature analyses of the AFM images of obliquely deposited films of gold shown in FIG. 2. Sampling wavelengths in A–C are: ((——)) 4 mn, ((——)) 8 nm, ((—)) 12 nm, ((– · –)) 20 nm, and ((– – –)) 40 nm.
  (A) Analysis of image of obliquely deposited film shown in FIG. 2A. An azimuthal orientation of 0° (x-axis) corresponds to a contour oriented parallel to the direction of deposition of the gold film.
  (B) Analysis of image of the obliquely deposited film shown in FIG. 2C. An azimuthal orientation of 0° corresponds to a contour oriented perpendicular to the direction of deposition of the gold film.
  (C) Analysis of image of the uniformly deposited film of golf shown in FIG. 2C. An azimuthal orientation of 0° corresponds to a contour oriented parallel to the scan direction.
  (D) Analysis of obliquely deposited film of gold shown in FIG. 2D. An azimuthal orientation of 0° represents a direction that is parallel to the direction of deposition. Sampling wavelengths from top: ((——)) 2 nm, ((– – –)) 4 nm, ((——)) 6 nm ((– · –)) 8 nm, and ((—)) 10 nm.
  (E) Comparison of contour lengths measured using a sampling wavelength of 4 nm: ((——)) from A; ((——)) from B; ((– – –)) from C.

Figure 7:
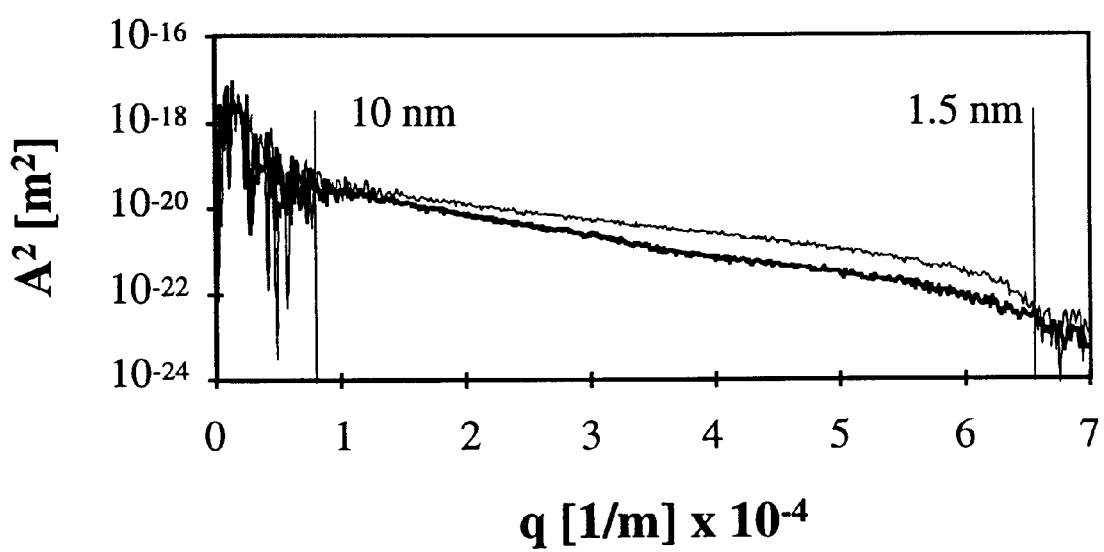

FIG. 7. Power spectrum of an obliquely deposited film of gold film obtained from the analysis of cross-sectional profiles of the AFM image shown in FIG. 2C. The thin line is the power spectrum obtained using cross-sectional profiles obtained in a direction parallel to the direction of deposition of the gold film. The thick line corresponds to the perpendicular direction. Anisotropy is evident between wavelengths of ~15 nm and ~1.5 nm.

Figure 8:
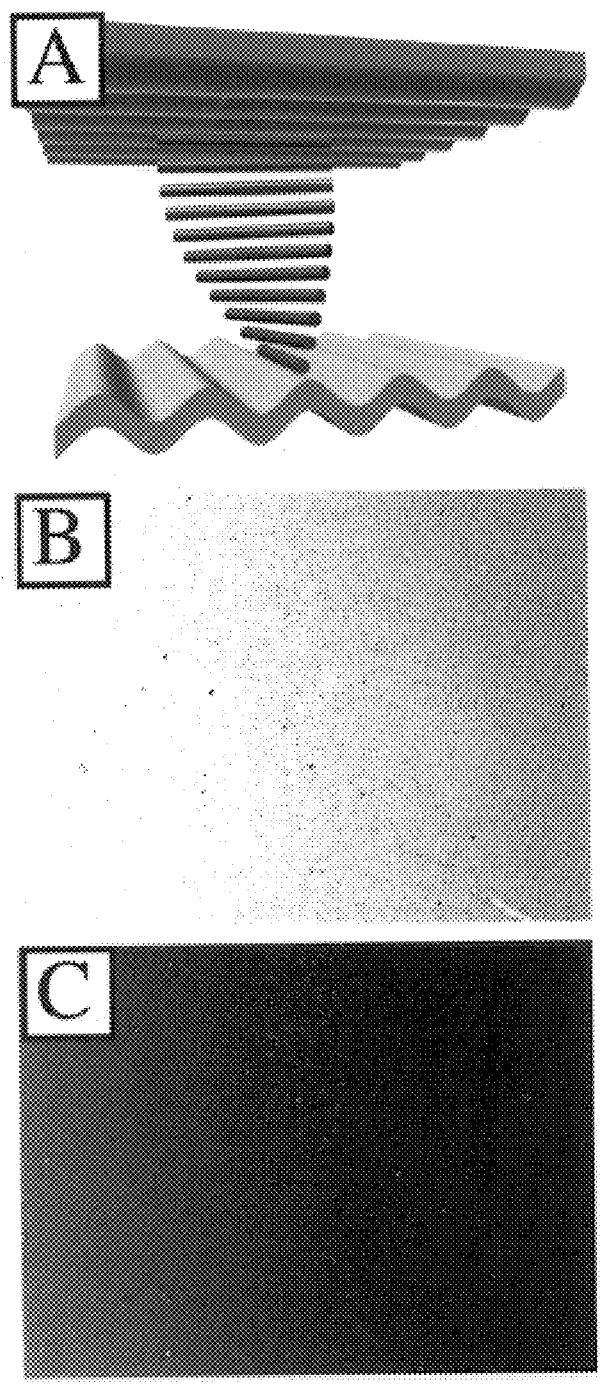

FIG. 8. (A)Schematic illustration of a physically twisted (90°) nematic LC cell. Near each surface, the orientation of the LC is parallel to the sinusoidal grooves;
  (B) Polarized light micrograph (transmission mode) of a twisted nematic LC cell formed using obliquely deposited gold films that support SAMs formed from propanethiol. The image was taken between cross polars;
  (C) Same as (B) but viewed between parallel polars. The thickness of the cell was 1 $\mu$m. The horizontal dimensions of the images in (B) and (C) are 1.1 mm.

Figure 9:
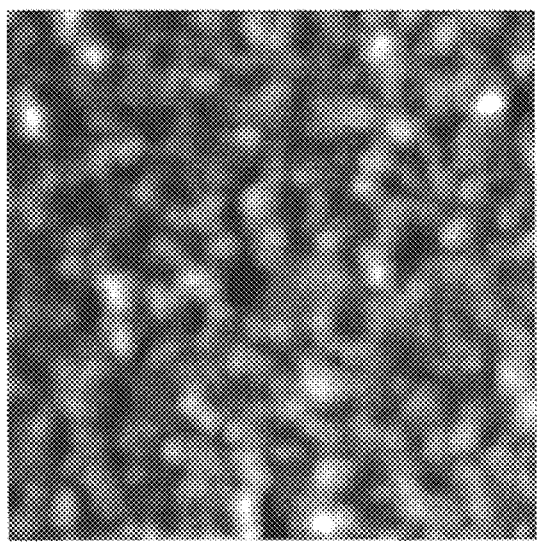
Figure 9:
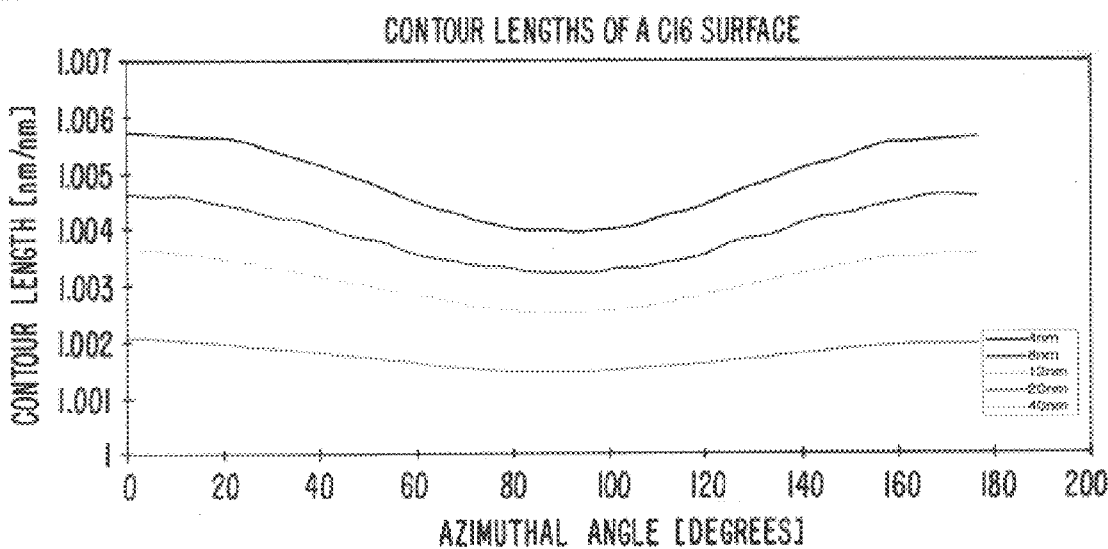
Figure 9:
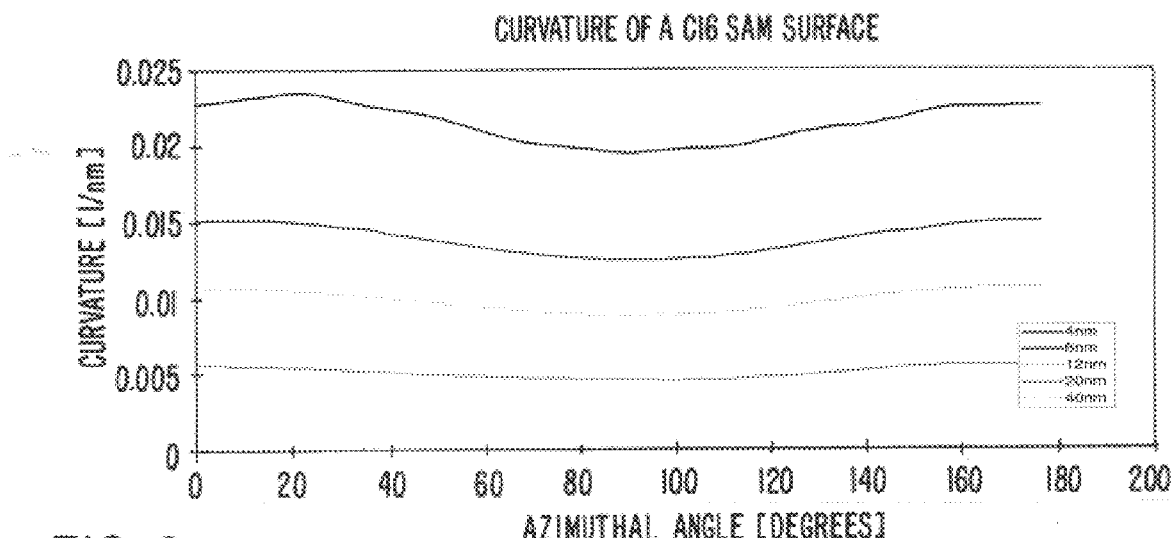

FIG. 9. (A) real space AFM image of an obliquely deposited film of gold that supports a SAM formed from hexadecanethiol. This image was used to create the two plots shown below it.
  (B) This plot shows an analysis of contour lengths, measured as a function of the azimuthal orientation of the contour. Two observations can be made from this plot (with reference to FIG. 5). First, the average length of a contour measured across the surface is reduce by adsorption of a SAM. For example, the average value of the contour length (sampling wavelength of 4 nm) is 1.07 nm/nm before adsorption of the SAM and 1.05 after adsorption of the SAM. Second, the anisotropy in the contour length is reduced by adsorption of the SAM. The anisotropy in contour length is 0.035 nm/nm for the bare gold film and 0.02 nm/nm for the gold film supporting a SAM.
  (C) This plot shows an analysis of the curvature of the contours, measured as a function of the azimuthal orientation of the contour. Two observations can be made from this plot (with reference to FIG. 6). First, the average curvature of a contour on the bare gold surface is 0.03 $nm^{-1}$, whereas this quantity is reduced to 0.02 $nm^{-1}$ by adsorption of the SAM. Second, the anisotropy in the curvature of the contour length is reduced from 0.01 $nm^{-1}$ to 0.005 $nm^{-1}$ by adsorption of the SAM.

DETAILED DESCRIPTION OF THE INVENTION AND THE PREFERRED EMBODIMENTS

Definitions

"SAM", self assembled monolayer.

As used herein, the terms "mesogen," "mesogenic" and "liquid crystal" are used essentially interchangeably to refer to molecules that form a liquid crystal phase. Liquid crystal is generally abbreviated "LC".

The terms "attached," and "adsorbed" as used herein encompass interactions including, but not limited to, covalent bonding, ionic bonding, chemisorption, physisorption and combinations thereof.

A "power spectrum," is a plot of $A^2$ versus q, where A is the amplitude of a mode of the surface and q is a wavevector of a Fourier component. $2\pi/q=\lambda$, where $\lambda$ is the wavelength of the surface roughness.

As used herein, "conical anchoring" refers to an anchoring characterized by an infinite number of anchoring directions making a fixed angle $\Theta$ with the normal to the interface which is different from 0 and $\pi/2$.

The term "degenerate anchoring" describes an anchoring mode in which there are an infinite number of anchoring directions.

"Homeotropic anchoring" refers to an anchoring mode characterized by one anchoring direction perpendicular to the plane of the interface.

"Multistable anchoring" refers to an anchoring mode characterized by a finite number of anchoring directions greater than one.

As used herein, the term "planar anchoring" refers to an anchoring characterized by anchoring directions parallel to the plane of the interface.

"Tilted anchoring," as used herein, refers to anchoring which makes an angle with the normal to the interface different than 0 and $\pi/2$.

A. Introduction

The methods described herein address the characterization of obliquely deposited metal films and obliquely deposited metal films with organic layers thereon. Using the methods of the invention, it is possible to detect anisotropy within metal films, particularly ultrathin, semi-transparent, obliquely deposited metal films using a scanning probe microscopic method such as scanning tunneling microscopy (STM) or atomic force microscopy (AFM).

The present invention provides quantitative methods of image analysis for characterizing the anisotropy within obliquely deposited metal films in terms of structural properties of the surface of these films. These structural properties can be used to predict the orientations of LCs supported on these metal films or supported on organic layers adsorbed onto these films.

Past studies have demonstrated that the mechanism through which the topography of a surface can influence the orientation of a supported LC depends on the wavelength ($\lambda$) and amplitude (A) of the roughness of the surface (Wolff et al., *Mol. Crys. & Liq. Crys.* 23: 187 (1973); Berreman, D. W., *Phy. Rev. Lett.* 26: 28, 1683 (1972); Barberi et al., *Phys. Lett. A.* 213: 293 (1996); Berreman, D. W., *Mol. Crys. & Liq. Crys.* 23: 215 (1973); Barberi et al., *J. Phys.: Condens. Matt.* 6: A275 (1994); Blinov et al., *J. Phys. II France* 2: 1287 (1992); Bodammer et al., *SPIE* 2731: 95 (1995)).

The present invention provides methods to characterize the anisotropic topography of an obliquely deposited metal surface by obtaining values related to the contour length of cross sectional profiles of the films and/or the mean curvature of the cross-sectional profiles and/or the power spectrum of the cross-sectional profiles. Each of these values can be obtained by using scanning probe microscopic techniques such as scanning tunneling microscopy and atomic force microscopy. Additionally, for those surfaces which satisfy the criterion $\lambda^2/A>L$, where L is the coherence length of the liquid crystal, the anchoring of LCs by these surfaces can be described in terms of the elastic free energy stored within LC supported on the surface of the gold. Moreover, using the methods of the invention, the elastic anchoring energy of a LC can be calculated from the structure of the surface. This method provides an account of experimental measurements that reflect the strength of azimuthal anchoring of LCs on gold films deposited obliquely. The invention also provides methods for selecting surfaces of a desired anisotropy such that when an analyte binds to a recognition moiety on the surface, the surface exhibits a desired level of response.

Each of the techniques of the invention is equally applicable to unelaborated metal surfaces, metal surfaces that are derivatized directly with recognition moieties, surfaces that are derivatized with organic layers containing recognition moieties and surfaces that combine two or more of these characteristics.

B. Analysis of the Contour of the Surface

In a first aspect, the present invention provides a method utilizing scanning probe microscopy for detecting anisotropy of a surface of an obliquely deposited metal film. The method comprises:

(a) determining a first value representative of a contour length of a cross-sectional profile in a first direction of a scanning probe microscopic image of the metal surface;

(b) determining a second value representative of a contour length of a cross-sectional profile in a second direction not parallel to the first direction of the scanning probe microscopic image of the metal surface;

(c) comparing the first value and the second value;

(d) determining the anisotropy on the basis of the comparison.

The anisotropy in obliquely deposited metal films of substantially any thickness can be determined utilizing the methods of the invention. In a preferred embodiment, the metal film has a thickness of from about 1 nanometer to about 200 nanometers. In another preferred embodiment, the metal film has a thickness of from about 5 nanometers to about 30 nanometers. The metal films can be either permeable or impermeable to materials such as liquids, solutions, vapors and gases.

The methods of the invention can be utilized to determine the anisotropy of obliquely deposited metal films having any composition and produced by any method known in the art. In a preferred embodiment, the metal film is deposited onto a substrate by physical vapor deposition.

Any metal that does not adversely affect the mesogenic layer can be used in the methods of the present invention. Metals that are presently preferred include, but are not limited to, gold, silver, platinum, palladium, nickel and copper. In one embodiment, more than one metal is used. The more than one metal can be present as an alloy or they can be formed into a layered "sandwich" structure, or they can be laterally adjacent to one another. In a preferred embodiment, the metal used for the substrate is gold. In a particularly preferred embodiment the metal used is gold layered on titanium.

Preferred metals films include those that are members selected from the group consisting of gold film, silver film, copper film, nickel film, platinum film, palladium film and combinations thereof. In yet another preferred embodiment, the metal film is a gold film.

In yet another preferred embodiment, the metal film further comprises a "recognition moiety" bound thereto. As used herein the term "recognition moiety" refers to a molecule or a portion of a molecule that interacts with a molecule of interest, referred to herein as an "analyte." In a further preferred embodiment, the metal film has an organic layer adsorbed thereon. The organic layer, the metal film or a combination thereof can comprise a recognition moiety. Recognition moieties and analytes are discussed in greater detail below.

The metal film can be deposited on a wide range of appropriate substrates including, but not limited to, magnetic, conducting, insulating and semiconducting materials, such as inorganic crystals and glasses, organic polymers, metals and the like. Appropriate substrates are discussed in detail in U.S. patent application Ser No. 09/127,383, filed Jul. 31, 1998 entitled "Optical Amplification of Molecular Interaction Using Liquid Crystals," the disclosure of which is incorporated herein by reference.

The methods of the invention can be used with any scanning probe microscopic technique, however, scanning tunneling microscopy and atomic force microscopy are currently preferred. When AFM is utilized, the scanning can be performed in either a contact mode (i. e., the probe tip contacts the surface) or in a non-contact mode (ie., long-range forces perturb the tip, which does not contact the surface). When STM is utilized, constant current imaging techniques (i.e., the tip is perturbed so as to keep the tunneling current constant and the changes in tip position are detected) or constant height techniques (i.e., the probe position is scanned across the sample and the changes in current are recorded) can be used. See, for example Wiesendanger, SCANNING PROBE MICROSCOPY: ANALYTICAL METHODS, Springer-Verlag, Berlin 1998.

In preferred embodiments, the surface is scanned first in one direction and then the surface is then physically rotated 90° and scanned again. The size of the scan is generally from about 100 nm square to about 1 mm square, more preferably from about 200 nm square to about 600 nm square.

The images can be utilized as acquired or they can be further processed by, for example, smoothing, flattening, zero-filling and the like. In a preferred embodiment, the images are flattened by using an algorithm which corrects for any large tilt of the sample with respect to the scanning probe. When the images are further processed by, for example Fourier analysis, this analysis is preferably performed on raw (non-flattened) images.

Although any method for reducing the image to a data set known in the art can be used in conjunction with the present invention, the image is preferably exported as a M×N matrix. The individual matrix elements can represent any surface characteristic or quantity associated with a particular characteristic. Exemplary surface characteristics include, peak height, valley depth, number of peaks and/or valleys per given area, lateral width of peaks and/or valleys and the like. Exemplary quantities include changes in frequency of oscillation of a scanning probe as it moves across the surface, tunnel current, impedance of the gap between the probe and the surface, resistance of the gap between the probe and the surface, lateral friction forces, thermal capacitance, magnetic forces, electrostatic forces and the like. In a preferred embodiment, each of the elements of the matrix represents the height of a point ($z_i$) on the surface.

Once the spectrum has been reduced to a M×N matrix, the matrix elements can be processed to extract useful information. A range of mathematical models and operations can be utilized to process the data from the matrix elements. During the processing, computer executed algorithms are useful. In a preferred embodiment, the matrix is read into an algorithm such as a FORTRAN program that calculates the square of the distance between points of heights zi and zi+λ separated by a horizontal distance λ in a chosen azimuthal direction:

$$cont_{i,\lambda}^2 = \frac{(z_{i+\lambda} - z_i)^2 + \lambda^2}{\lambda^2} \quad (1)$$

From Equation 1, the relationship between the local slope of the surface $[(z_i-z_{i+\lambda})/\lambda]$ and the contour length is apparent.

The average of the square of the contour length can be calculated for a family of cross-sectional profiles obtained from a scanning probe microscopic image using Equation 2:

$$\overline{cont_\lambda^2} = \sum_i^n \frac{cont_{i,\lambda}^2}{n} \quad (2)$$

The square root of Equation 2 is the RMS contour length of the surface and can be calculated from each image for different wavelengths (λ) and azimuthal sampling orientations. When sampling azimuthal orientations not at 0° or 90° (measured from a vector parallel to the direction of deposition of the gold), a simple linear interpolation can be used to determine characteristics (e.g., the height) of sampling points that fall between actual data points in the scanning probe image. When the minimum wavelength of sampling covers several experimental data points, the use of the linear interpolation will generally not introduce a significant error into the analysis.

In a presently preferred embodiment, the comparison of the first and second contour lengths is accomplished by preparing a plot of the contour length versus the azimuthal orientation of the contour length. See, for example, FIG. 5. Though anisotropy is not apparent from a visual examination of orthogonal cross-sectional profiles obtained from an obliquely deposited metal surface (see, FIG. 4), when a plot of contour length versus azimuthal orientation is examined, the anisotropy becomes apparent. Thus, in a preferred embodiment, the comparison utilizes a plot of contour length versus azimuthal orientation.

C Analysis of the Curvature of the Surface

Whereas the analysis of contour lengths presented above permits identification of anisotropy within the surface in terms of the average slope of the surface (first spatial derivative), the anchoring of an LC on a surface is generally influenced by the mean curvature of the surface (second spatial derivative) rather than its local slope. Indeed it is possible to construct hypothetical surface profiles such that the RMS slope differs in orthogonal azimuthal directions yet the curvature is the same.

A model surface with different contour lengths in orthogonal directions but equal curvature values in both directions can be constructed from 2 orthogonal sine curves. If one direction is composed of a sinewave of an amplitude $A_0$ and a wavevector q, the corresponding contour length and curvature values are proportional to $A_0 q_0$ and $A_0 q_0^2$, respectively. If the curvature is kept constant then the orthogonal sinewave can be described by any new values of A and q that satisfy Equation 3:

$$A_{new} q_{new}^2 = A_0 q_0^2 \quad (3)$$

The contour length will be different for any new values of the amplitude and wavevector that are different from the original values and which satisfy the previous equation.

In a second aspect, the present invention provides a method utilizing scanning probe microscopy for detecting anisotropy of a surface of an obliquely deposited metal film. The method comprising:

(a) determining a first value representative of a curvature of a cross-sectional profile in a first direction of a scanning probe microscopic image of the metal surface;

(b) determining a second value representative of a curvature of a cross-sectional profile in a second direction not parallel to the first direction of the scanning probe microscopic image of the metal surface;

(c) comparing the first value and the second value;

(d) determining the anisotropy on the basis of the comparison.

The curvature of a surface, which in one embodiment is calculated as described above, can be directly tied into the elastic energy density (due to twist, splay and bend) of a LC placed on the surface by, for example, Equation 4:

$$F_d = \frac{1}{2}K_1(div n)^2 + \frac{1}{2}K_2(n \cdot curl n)^2 + \frac{1}{2}K_3(n \times curl n)^2 \quad (4)$$

See, for example, (De Gennes et al., THE PHYSICS OF LIQUID CRYSTALS; Oxford University Press, Oxford (1993)). An obliquely deposited metal film possess anisotropic curvature (different values of curvature measured in orthogonal directions). Thus, preferred equations comprise leading order terms that are proportional to the curvature of the surface, as are present in exemplary Equation 4.

A presently preferred procedure used to extract the curvature from scanning probe microscopic images of the metal films is similar to that described above for the contour analysis. Moreover, the discussion above, concerning the nature of the metal films, processing of the data, use of algorithms, computers and the like is generally applicable to this aspect of the invention.

In a preferred embodiment, a central point difference method, such as that provided by Equation 5 was used to calculate the square of the curvature as a function of wavelength and azimuthal direction at all points of the image (except near edges):

$$curv_{i,\lambda}^2 = \left[ \frac{z_{i+\lambda} - 2 \cdot z_i + z_{i-\lambda}}{\lambda^2} \right]^2 \quad (5)$$

Once the values for the curvature have been obtained, these values can then be averaged for a given azimuthal scan direction, from which the RMS values of curvature can evaluated.

$$\overline{curv_\lambda^2} = \sum_i^n \frac{curv_{i,\lambda}^2}{n} \quad (6)$$

The curvature analysis described above can be used to confirm the existence of structural anisotropy within an obliquely deposited metal film. The curvature will also influence the orientations of supported LCs.

Other methods for calculating the curvature of a particular surface will be apparent to those of skill in the art.

D. Estimation of Liquid Crystal Anchoring Energy

In a third aspect, the present invention provides a method utilizing scanning probe microscopy for detecting anisotropy of a surface of an obliquely deposited metal film. The method comprises:

comparing a first power spectrum for a scanning probe microscopic image of the surface obtained in a first direction and a second power spectrum for a scanning probe microscopic image of the surface obtained in a second direction not parallel to the first direction, thereby detecting the anisotropy.

Methods for estimating elastic free energy density of a LC supported on a surface are known in the art. In one embodiment, the Berreman strain model (Berreman, D. W., *Phy. Rev. Lett.* 26: 28, 1683 (1972); Berreman, D. W., *Mol. Crys. & Liq. Crys.* 23: 215 (1973)) is used to estimate the elastic free energy density of a LC supported on a surface with sinusoidal roughness of one wavelength:

$$F = \frac{K_3}{4}A^2q^3 \quad (7)$$

where A is the amplitude, q is the wavevector of the sine wave, and $K_3$ is the bend elastic constant of the LC. This model contains a number of approximations, including the assumptions that: (i) the LC director lies across the corrugations; (ii) there exists no (local) azimuthal variations in the orientation of the LC; and (iii) the elastic constants (splay and bend) of the LC are equal. The result above is generally useful for surfaces with a single mode of roughness. Because, obliquely deposited substrates possess a spectrum of wavelengths and amplitudes of roughness, in certain embodiments other models are preferred.

In a presently preferred embodiment, a Fourier representation, an example of which is provided in Equation 8, is used to describe an arbitrary surface as a linear superposition of a family of sine waves:

$$z(x) = \sum_k A_k \sin(2\pi x q_k) \quad (8)$$

In one embodiment, the elastic energy density from such a representation of a surface can be estimated as, $$F = \frac{K}{4}\sum_k A_k^2 \cdot q_k^3 \quad (9)$$

Although many different sets of $\{A_k, q_k\}$ can be used to represent a given surface profile, the elastic energy density is not necessarily the same for each set. This conclusion is supported by the observation that the profile of a single mode surface can be described by either a single sine function of amplitude A or by set of m sine functions with scaled amplitudes A/m. As the free energy density given by Equation 9 is not the same for both of the above-described representations of the surface, in a preferred embodiment, a multimode analysis such as that described by Berreman is utilized (Berreman, D. W., *Mol. Crys. & Liq. Crys.* 23: 215 (1973)).

In a fourth aspect, the present invention also provides a method utilizing scanning probe microscopy for calculating the difference in elastic free energy between a liquid crystal anchored to an obliquely deposited metal surface in a direction parallel to a direction of metal deposition and a liquid crystal anchored to said surface in a direction perpendicular to said direction of metal deposition. The method comprises obtaining amplitude and wavenumber data for an obliquely deposited metal surface in a direction parallel to said direction of metal deposition; calculating $F_0°$ utilizing said amplitude and wavenumber data for said direction parallel to said direction of metal deposition; obtaining amplitude and wavenumber data for an obliquely deposited metal surface in a direction perpendicular to said direction of metal deposition; calculating $F_0°$ utilizing said amplitude and wavenumber data for said direction perpendicular to said direction of metal deposition to calculate $F_{90}°$; and calculating the difference between $F_{90}$20 and $F_0°$.

The amplitude and wavenumber data can be acquired from the analysis of scanning probe images acquired from the surface of interest. Useful methods for acquiring this data are generally the same as those described herein for obtaining a power spectrum of a surface.

$F_{90}°$ and $F_0°$ can be calculated by methods known to those of skill in the art. In a preferred embodiment, the calculation of $F_{90}°$ and $F_0°$ utilizes an equation with crossed terms in the summation such as Equation 10:

$$g = \frac{K_3}{2} \sum_j \sum_k A_j A_k q_j^2 q_k^2 \cdot \cos[x(q_j - q_k)] \cdot \exp[-(q_j + q_k) \cdot z] \quad (10)$$

where $A_j$ and $A_k$ are the amplitudes of the Fourier components, $q_j$ and $q_k$ are the associated wavevectors, x is the lateral position along the sine wave, z is the height from the surface, and $K_3$ is the bend elastic constant of the LC. This equation is based on the assumption that all elastic constants of the LC are approximately equal to $K_3$. Unlike the expression in Equation 9, any family of sinusoidal functions that accurately represents the profile of the surface will give the same free energy density when using Equation 10 (after averaging over all values of x and integrating from z=0 (the surface) to far from the surface). Other appropriate equations will be apparent to those of skill in the art.

To derive values of $F_{90}°$ and $F_0°$ from an equation such as Equation 10, in a preferred embodiment, the equation is integrated from z=0 to z=∞ over all x. When the $A_k$ and $q_k$ data is from the direction parallel to the deposition of the metal layer, the result will be a value for $F_{90}°$. Similarly, when the $A_k$ and $q_k$ data is acquired in the direction perpendicular to the direction of the metal deposition, the value obtained will be $F_{90}°$.

Other methods of calculating the elastic energy density for a particular surface and a supported LC will be apparent to those of skill in the art.

The influence of the roughness of a surface on the elastic energy density of a supported LC can be evaluated using Equation 10 if the constraint $\lambda^2/A > L$ is satisfied. In an exemplary surface, a typical grain size has a lateral dimension of ~20 nm and an amplitude (A) of 2 nm. Thus, $\lambda^2/A$ is about 200 nm. This value is an order of magnitude larger than the typical coherence length of a LC as 5CB (~15 nm). Thus, the free energy density of a LC supported on an obliquely deposited film of metal can be described in terms of a elastic mechanism such as that set forth in Equation 10.

The difference in the elastic free energy between a LC oriented parallel and a LC oriented perpendicular to the direction of deposition of the gold can be evaluated as, $$\Delta F = |F_{90°} - F_{0°}| \quad (11)$$

In an exemplary embodiment, the combining can be performed by: (i) extracting data $[A_k, q_k]$ from a power spectrum such as that shown in FIG. 7 for a direction parallel to the metal deposition; (ii) substitute these $[A_k, q_k]$ into Equation 10; integrate from z=0 to z=∞, average over all x to arrive at $F_0°$; (iv) repeat (i) to (iii) using data for the direction perpendicular to the metal deposition; (v) take the difference as described in Equation 11.

The effect of variations in the values of A and q are apparent upon examining a power spectrum for a representative surface. For example, FIG. 7 is a plot of $A^2$ versus q (a "power spectrum") for an obliquely deposited gold film. The amplitudes of each mode of the surface ($A^2$ in FIG. 7) in the parallel and perpendicular directions differ appreciably at values of q greater than $1 \times 10^4$ m$^{-1}$, corresponding to wavelengths of ~10 nm, and then converge again at values of q of $7 \times 10^4$ m$^{-1}$, corresponding to wavelengths of approximately ~1.5 nm.

Utilizing the methodology described above, an anchoring energy for a particular LC on a surface can be calculated. For example, in a system utilizing nematic 5CB at room temperature ($K_3 = 10 \times 10^{-9}$ mN) and a film of evaporated gold (FIG. 7), an anchoring energy of ~0.015 mJ/m$^2$ can be calculated. The higher elastic energy corresponds to the orientation of the LC parallel to the direction of deposition of the gold.

In another embodiment of this aspect of the invention, the azimuthal energy, evaluated as discussed above, can be utilized to estimate the maximum thickness, L, of a LC required to form a twisted nematic LC cell. In such a cell, the LC is anchored to two opposing surfaces, with the mesogen located in a space between the two surfaces.

To form a twisted nematic LC cell (see, FIG. 8A), the interactions of the LC with the confining surfaces must be sufficiently strong to support the formation of the twist deformation within the LC. The twist deformation within the LC can only be formed if the azimuthal energy exceeds a certain threshold. By using the azimuthal anchoring energy ($\Delta F$) evaluated above and Equation 12, the minimum thickness L of a twisted nematic LC cell that can be formed under the influence of an azimuthal anchoring energy $\Delta F$ can be calculated:

$$L = \frac{K_2}{2\Delta F}\left(\frac{\pi}{2}\right)^2 \quad (12)$$

An exemplary twisted nematic cell, consisting of 5CB was fabricated using optical cells constructed from propanethiol SAMs on the surface of obliquely deposited films of gold. Analysis of SAMs formed from propanethiol, by the methods described herein, indicate the same level of anisotropy in the SAMs as that seen in the gold surfaces onto which they are adsorbed.

By using a twist elastic constant (Blinov et al., ELECTRO-OPTIC EFFECTS IN LIQUID CRYSTAL MATERIALS; Springer-Verlag: New York (1994)) of $6.4 \times 10^{-9}$ mN and the value of $\Delta F$ evaluated above, the strength of the azimuthal anchoring energy can be sufficient to permit the formation of twisted cells as thin a 0.5 $\mu$m. As shown in FIG. 8A, a twisted nematic cell can be formed with obliquely deposited films of gold using cells as thin as 1 $\mu$m

E. Control of Surface Properties

In addition to providing methods for examining the anchoring of LCs on obliquely deposited metal films, the present invention also provides methods for examining organic layers of diverse compositions that are adsorbed onto obliquely deposited metal films. Further, the invention provides methods for studying the effect of changes in the organic layers, the metal surfaces or combinations thereof on a LC anchored on the organic layer, the metal film or combinations thereof. These changes include, for example, changes that occur when a recognition moiety on the organic layer, the metal film or a combination thereof interacts with its corresponding analyte.

Thus, in a fifth aspect, the present invention provides a method of selecting an anisotropic surface, the anisotropy causing the surface to respond in a detectable manner at a desired level of response to an analyte that interacts with the surface. The method comprises:

(a) obtaining a first power spectrum in a first direction and a second power spectrum in a second direction not parallel to the first direction of one said surface having a first property and characterizing the anisotropy of the surface using the power spectra; and (b) repeating step (a) at least once on surfaces having a second property, the property selected such that the anisotropy approaches a preselected value that will produce a desired level of response of the surface to the analyte, until the level is achieved.

This method provides a means to characterize surfaces that have different properties and to select from among the characterized surfaces to choose a surface that exhibits a useful level of anisotropy. In general, a useful level of anisotropy is that having a wavelength and amplitude that have magnitudes that are on the order of the size of the analyte that is to be detected. Thus, for example, if the surface is designed to detect the interaction of a protein with the surface, the most useful surfaces are those having anisotropy characterized by an amplitude and wavelength on the order of the size of the protein. Although such surfaces are presently viewed as ideal, this is not meant to imply that surfaces which do not satisfy these criteria will not also be useful for detecting analytes. In fact, it is within the scope of the present invention to adjust the sensitivity of the surface to the analyte by choosing a surface that has anisotropy of a character that allows the detection of the analyte to occur at a desired response level. For example, if a surface is too sensitive to the analyte, this can be modified by utilizing a surface with an anisotropy less closely matched to the analyte than the surface that is too responsive.

The preselected value can be any useful value. The value will generally depend on the type of LC cell used. For example, if a twisted LC cell is used, then the preselected value of the anisotropy is sufficient to create an anchoring energy at the surface that will induce the twist within the cell. For a cell with a 90 degree twist, a LC with a twist elastic constant of $6.4 \times 10^{-9}$ mN, and a cell thickness of 5 micrometers, the preselected value of the anisotropy calculated from the power spectra of the surface is preferably greater than 0.0015 mJ/m$^2$ (as calculated from Equation 12).

Any of a range of surfaces can be utilized including, for example, glasses, metals, inorganic oxides, organic polymers and the like. In a preferred embodiment, the surface comprises a metal film obliquely deposited onto a substrate.

In another preferred embodiment, the surface comprises an organic layer. The organic layers appropriate to this aspect are generally the same as those discussed herein in other contexts.

In another preferred embodiment, the surface further comprises a recognition moiety. The recognition moiety can be attached to the surface, the organic layer or a combination thereof. Recognition moieties appropriate to this aspect of the invention are generally the same as those described herein in other contexts.

The surfaces with which the method of the invention can be practiced have a number of characteristic properties derived from their manufacture. For example, properties relevant to surfaces having just an obliquely deposited metal layer include, the thickness of the layer, the composition of the layer, the angle at which the layer is deposited, the rate at which the metal layer is deposited and the size and shape of the metal particles or crystals that comprise the layer.

In a preferred embodiment, the first and second property are members independently selected from the group consisting of the identity of the metal film, angle of depositing the metal film, rate of depositing the metal film, identity of the substrate and combinations thereof.

In another preferred embodiment, the metal film is a member selected from the group consisting of gold film, silver film, copper film, nickel film, platinum film, palladium film and combinations thereof. In a further preferred embodiment, the metal film is a gold film.

Surfaces that also comprise an organic layer can vary in each of the above properties as well as properties relevant to the organic layer. These include properties such as the chemical composition and structure of the organic layer constituents, homogeneity of the organic layer (i.e. one or more distinct constituents comprise organic layer), density of organic layer, etc.

Surfaces, substrates, metal layer, organic layers, recognition moieties and the like with which the present invention is useful are generally described in U.S. patent application Ser. No. 09/127,383, filed Jul. 31, 1998 entitled "Optical Amplification of Molecular Interaction Using Liquid Crystals." Other useful surface constituents will be apparent to those of skill in the art.

In a sixth aspect, the invention provides a method of selecting an anisotropic surface having recognition moieties thereon whose anisotropy causes the surface to respond in a detectable manner to an analyte that interacts with the recognition moieties at a desired level of response. The method comprises:

(a) obtaining a first power spectrum in a first direction and a second power spectrum in a second direction not parallel to the first direction of one said surface in which the recognition moieties are present in a first density per unit area. The power spectra are obtained without analyte interacting with the recognition moieties. Two additional power spectra are obtained of the surface having analyte interacting with the recognition moieties. The first two and the second two power spectra are then compared to determine a difference therebetween that is representative of the degree of anisotropy of the surface.

In a preferred embodiment, the method further comprises repeating the obtaining power spectra and comparing power spectra steps at least once on surfaces having densities of analyte recognition moieties per unit area that are different from the first density, the densities selected such that the difference successively approaches a preselected value that will produce a desired level response of the surface to the analyte, until the level is achieved.

For example, the comparison of power spectra can be performed by calculating the elastic anchoring energy before and after binding of the analyte to each surface, as described in conjunction with the fourth aspect of the invention. A surface for which there is no change in the elastic anchoring energy upon binding of the analyte will less preferred than a surface for which there is a finite change in the elastic anchoring energy upon binding of the analyte. The preselected value can also, for example, be determined by the geometry of the LC cell. An exemplary cell is one in which the LC cell is formed such that the elastic twist energy stored in the LC within the cell is A and the anchoring energy prior to binding of the analyte is B, where B is greater than A. Thus, a desired change in the elastic anchoring energy upon binding of the analyte will be greater than the absolute value of B–A. A surface for which the difference in the elastic anchoring energy upon binding of the analyte is less than B–A will be less preferred than a surface for which the difference in the elastic anchoring energy is greater than B–A.

The recognition moiety can be attached to the metal surface, an organic layer or both the metal surface and the organic layer. In a preferred embodiment, the recognition moiety is attached to a component of an organic layer. Preferred organic layers are those that form self-assembled monolayers. Both organic layers and recognition moieties are discussed in greater detail below.

The density per unit area of recognition moiety, or any other organic layer constituent, can be controlled by manipulating the concentration of the particular component in the mixture from which the organic layer is adsorbed onto the metal surface. It is known in the art that organic layers, particularly SAMs comprising organosulfur moieties, having two or more distinct components distribute the distinct components substantially evenly over the metal surface. Similar components generally do not form homogeneous "islands" of one component. See, for example, Wasserman et al., *J. Am. Chem. Soc.*, 111: 5852 (1989); Tidswell et al, *Phys. Rev. B.*, 41: 1111 (1990) and Ulman, AN INTRODUCTION TO ULTRATHIN ORGANIC FILMS: FROM LANGMUIR-BLODGETT TO SELF-ASSEMBLY, Academic Press, Boston, 1991.

Additional characteristics of organic layers and recognition moieties are discussed in the succeeding paragraphs.

F. Organic Layers

Similar to a metal film anchoring a mesogenic layer, an organic layer attached to the metal film can provide such anchoring. Thus, in each of the above-described aspects of the invention, the surface of the metal film can further comprise an organic layer adhered onto the surface. A wide range of organic layers can be used in conjunction with the present invention. These include organic layers formed from, for example, organosulfurs (e.g., organo-thiols, -sulfides, and -disulfides), organosilanes, amphiphilic molecules, cyclodextrins, polyols (e.g., poly (ethyleneglycol), poly(propyleneglycol), fullerenes, and biomolecules. In a particularly preferred embodiment, the organic layer comprises a recognition moiety. Other useful organic layer constituents will be apparent to those of skill in the art.

An organic layer that is bound to, supported on or adsorbed onto, the surface of the substrate can anchor a mesogenic layer. As used herein, the term "anchoring" refers to the set of orientations adopted by the molecules in the mesogenic phase. The mesogenic layer will adopt particular orientations while minimizing the free energy of the interface between the organic layer and the mesogenic layer. The orientation of the mesogenic layer is referred to as an "anchoring direction." A number of anchoring directions are possible.

As used herein, the term "mesogenic layer" refers to a plurality of molecules that are capable of forming a liquid crystal. The molecules can be monomeric, oligomeric or polymeric. In certain embodiments, the mesogenic layer will be in its liquid crystalline state, while in others, the mesogenic layer will be in a "pre-liquid crystalline" state. Mesogenic layers discussed in greater detail in U.S. patent application Ser. No. 09/127,383, filed Jul. 31, 1998 entitled "Optical Amplification of Molecular Interaction Using Liquid Crystals" which is incorporated herein by reference.

The particular anchoring direction adopted by a mesogenic layer will depend upon the nature of the mesogenic layer, the organic layer and the substrate. Anchoring directions of use in the present invention include, for example, conical anchoring, degenerate anchoring, homeotropic anchoring, multistable anchoring, planar anchoring and tilted anchoring. Planar anchoring and homeotropic anchoring are preferred with planar anchoring being most preferred.

The anchoring of mesogenic compounds by surfaces has been extensively studied for a large number of systems. See, for example, Jerome, B., *Rep. Prog. Phys.* 54: 391–451 (1991). The anchoring of a mesogenic substance by a surface is specified, in general, by the orientation of the director of the bulk phase of the mesogenic layer. The orientation of the director, relative to the surface, is described by a polar angle (measured from the normal of the surface) and an azimuthal angle (measured in the plane of the surface).

Control of the anchoring of mesogens has been largely based on the use of organic surfaces prepared by coating surface-active molecules or polymer films on inorganic (e.g., silicon oxide) substrates followed by surface treatments such as rubbing. Other systems which have been found useful include surfaces prepared through the reactions of organosilanes with various substrates. See, for example, Yang et al., In, MICROCHEMISTRY: SPECTROSCOPY AND CHEMISTRY IN SMALL DOMAINS; Masuhara et al., Eds.; North-Holland, Amsterdam, 1994; p.441.

Molecularly designed surfaces formed by organic layers on a substrate can be used to anchor mesogenic layers and to control both the azimuthal and polar orientations of a supported mesogenic layer. For example, patterned organic layers made from $CH_3(CH_2)_{14}SH$ and $CH_3(CH_2)_{15}SH$ on obliquely deposited gold produce a supported mesogenic layer which is twisted 90°. Other anchoring modes are readily accessible by varying the chain length and the number of species of the organic layer constituents. See, Gupta, V. K.; Abbott, N. L., *Science* 276: 1533–1536 (1997). In a preferred embodiment, SAMs are patterned on a surface.

Transitions between anchoring modes have been obtained for mesogenic layers anchored on a series of organic layers by varying the structure of the organic layer. The structural features which have been found to affect the anchoring of mesogenic compounds include, for example, the density of molecules within the organic layer, the size and shape of the molecules constituting the organic layer and the number of individual layers making up the bulk organic layer.

The density of the organic layer on the substrate has been shown to have an effect on the mode of mesogen anchoring. For example, transitions between homeotropic and degenerate anchorings have been obtained on surfactant monolayers by varying the density of the monolayers. See, Proust et al., *Solid State Commun.* 11: 1227–30 (1972). Thus, it is within the scope of the present invention to tailor the anchoring mode of a mesogen by controlling the density of the organic layer on the substrate.

The molecular structure, size and shape of the individual molecules making up the organic layer also affects the anchoring mode. For example, it has been demonstrated that varying the length of the aliphatic chains of surfactants on a substrate can also induce anchoring transitions: with long chains, a homeotropic anchoring is obtained while with short chains, a conical anchoring is obtained with the tilt angle Θ increasing as the chain becomes shorter. See, for example, Porte, *J. Physique* 37: 1245–52 (1976). Additionally, recent reports have demonstrated that the polar angle of the mesogenic phase can be controlled by the choice of the constituents of the organic layer. See, Gupta, V. K.; Abbott, N. L., *Langmuir* 12: 2587–2593 (1996). Thus, it is within the scope of the present invention to engineer the magnitude of the anchoring shift as well as the type of shift by the judicious choice of organic layer constituents.

A wide variety of organic layers are useful in practicing the present invention. These organic layers can comprise monolayers, bilayers and multilayers. Furthermore, the organic layers can be attached to the metal surface, or other substrate, by covalent bonds, ionic bonds, physisorption, chemisorption and the like, including, but not limited to, hydrophobic interactions, hydrophilic interactions, van der Waals interactions and the like.

In a presently preferred embodiment, organic layers which form self-assembled monolayers are used. The use of self-assembled monolayers (SAMs) formed from alkanethiols on thin, semitransparent films of gold in studies on the anchoring of liquid crystals on surfaces has been reported. See, Drawhom, R. A.; Abbott, N. L., *J. Phys. Chem.* 45: 16511 (1995). The principal result of that work was the demonstration that SAMs formed from n-alkanethiols with long ($CH_3(CH_2)_{15}SH$) and short ($CH_3(CH_2)_4SH$ or $CH_3(CH_2)_9SH$) aliphatic chains can homeotropically anchor mesogens. In contrast, single-component SAMs ($CH_3(CH_2)_nSH$, $2<n>15$) caused non-uniform, planar, or tilted anchoring at room temperature.

In the discussion that follows, self-assembled monolayers are utilized as an exemplary organic layer. This use is not intended to be limiting. It will be understood that the various configurations of the self-assembled monolayers and their methods of synthesis, binding properties and other characteristics are equally applicable to each of the organic layers of use in the present invention.

Self-assembled monolayers are generally depicted as an assembly of organized, closely packed linear molecules. There are two widely-used methods to deposit molecular monolayers on solid substrates: Langmuir-Blodgett transfer and self-assembly. Additional methods include techniques such as depositing a vapor of the monolayer precursor onto a substrate surface.

The composition of a layer of a SAM useful in the present invention, can be varied over a wide range of compound structures and molar ratios. In one embodiment, the SAM is formed from only one compound. In other embodiments, the SAM is formed from two or more components. In a preferred embodiment, when two or more components are used, one component is a long-chain hydrocarbon having a chain length of between 10 and 25 carbons and a second component is a short-chain hydrocarbon having a chain length of between 1 and 9 carbon atoms. In particularly preferred embodiments, the SAM is comprises $CH_3(CH_2)_{15}SH$ and $CH_3(CH_2)_4SH$ or $CH_3(CH_2)_{15}SH$ and $CH_3(CH_2)_9SH$. In any of the above described embodiments, the carbon chains can be functionalized at the ω-terminus or on the chain with pendent recognition moieties (e.g., $NH_2$, COOH, OH, CN) and/or at internal positions of the chain (e.g., aza, oxa, thia) or at both the ω-terminus and internal positions of the chain.

When the organic layer is derivatized with a recognition moiety, the assemblies are useful for detecting the interaction of analytes and the recognition moiety. In a particularly preferred embodiment, the organic layer supports a mesogenic layer that is perturbed upon interaction between the analyte and the recognition moiety. The perturbation is dependent upon the anchoring energy of the surface. By selecting a surface having a desired anchoring energy, it is possible to control the onset and the degree of perturbation of the mesogenic layer upon the interaction of the recognition moiety and the analyte.

G. Recognition Moieties

As used herein, the term "recognition moiety" refers to molecules which are attached to the metal film or to one or more organic layer components. The recognition moieties can interact with the analyte via either attractive or repulsive mechanisms. In one exemplary embodiment, the analyte and the recognition moiety form an intimately associated pair by, for example, covalent bonding, ionic bonding, ion pairing, van der Waals association and the like. In another exemplary embodiment, the analyte and recognition moiety interact by a repulsive mechanism such as incompatible steric characteristics, charge-charge repulsion, hydrophilic-hydrophobic interactions and the like.

Recognition moieties can be selected from a wide range of small organic molecules (e.g., drugs, pesticides, toxins, etc.), organic functional groups (e.g., amines, carbonyls, carboxylates, etc.), biomolecules, metals, metal chelates and organometallic compounds.

When the recognition moiety is an amine, in preferred embodiments, the recognition moiety will interact with a structure on the analyte which reacts by interacting (e.g., binding, complexing) with the amine (e.g., carbonyl groups, alkylhalo groups). In another preferred embodiment, the amine is protonated by an acidic moiety on the analyte of interest (e.g., carboxylic acid, sulfonic acid).

In certain preferred embodiments, when the recognition moiety is a carboxylic acid, the recognition moiety will interact with the analyte by, for example, complexation (e.g., metal ions). In still other preferred embodiments, the carboxylic acid will protonate a basic group on the analyte (e.g. amine).

In another preferred embodiment, the recognition moiety is a drug moiety. The drug moieties can be agents already accepted for clinical use or they can be drugs whose use is experimental, or whose activity or mechanism of action is under investigation. The drug moieties can have a proven action in a given disease state or can be only hypothesized to show desirable action in a given disease state. In a preferred embodiment, the drug moieties are compounds which are being screened for their ability to interact with an analyte of choice. As such, drug moieties which are useful in practicing the instant invention include drugs from a broad range of drug classes having a variety of pharmacological activities.

The above enumerated molecules as well as other species can be attached to the organic layer by methods well-known to those of skill in the art. Ample guidance can be found in literature devoted to, for example, the fields of bioconjugate chemistry and drug delivery. For example, one of skill, faced with a recognition moiety comprising an available amine will be able to choose from among a variety of amine derivatizing reactions, locate an appropriately fimctionalized partner (e.g, a carboxylic acid terminated thiol) for the organic layer and react the partners under conditions chosen to effect the desired coupling (e.g., dehydrating agents, e.g., dicyclohexylcarbodiimide). See, for example, MODIFICATION OF PROTEINS: FOOD, NUTRITIONAL, AND PHARMACOLOGICAL ASPECTS, Feeney et al., Eds., American Chemical Society, Washington, D.C., 1982, pp. 370–387; POLYMERIC DRUGS AND DRUG DELIVERY SYSTEMS, Dunn et al., Eds., American Chemical Society, Washington, D.C., 1991.

When the recognition moiety is a chelating agent, crown ether or cyclodextrin, host-guest chemistry will dominate the interaction between the recognition moiety and the analyte. The use of host-guest chemistry allows a great degree of recognition-moiety-analyte specificity to be engineered into a device of the invention. The use of these compounds to bind to specific compounds is well known to those of skill in the art. See, for example, Pitt et al., "The Design of Chelating Agents for the Treatment of Iron Overload," In, INORGANIC CHEMISTRY IN BIOLOGY AND MEDICINE; Martell, Ed.; American Chemical Society, Washington, D.C., 1980, pp. 279–312; Lindoy, THE CHEMISTRY OF MACROCYCLIC LIGAND COMPLEXES; Cambridge University Press, Cambridge,1989; Dugas, BIOORGANIC CHEMISTRY; Springer-Verlag, New York, 1989, and references contained therein.

Additionally, a manifold of routes allowing the attachment of chelating agents, crown ethers and cyclodextrins to other molecules is available to those of skill in the art. See, for example, Meares et al., "Properties of In vivo Chelate-Tagged Proteins and Polypeptides." In, MODIFICATION OF PROTEINS: FOOD, NUTRITIONAL, AND PHARMACOLOGICAL ASPECTS;" Feeney, et al., Eds., American Chemical Society, Washington, D.C., 1982, pp. 370–387; Kasina et al., *Bioconjugate Chem.* 9: 108–117 (1998); Song et al., *Bioconjugate Chem.* 8: 249–255 (1997).

In another preferred embodiment, the recognition moiety forms an inclusion complex with the analyte of interest. In a further preferred embodiment, the recognition moiety is a cyclodextrin or modified cyclodextrin. Cyclodextrins are a group of cyclic oligosaccharides produced by numerous microorganisms. Cyclodextrins have a ring structure which has a basket-like shape. This shape allows cyclodextrins to include many kinds of molecules into their internal cavity. See, for example, Szejtli, CYCLODEXTRINS AND THEIR INCLUSION COMPLEXES; Akademiai Klado, Budapest, 1982; and Bender et al., CYCLODEXTRIN CHEMISTRY, Springer-Verlag, Berlin, 1978.

Cyclodextrins are able to form inclusion complexes with an array of organic molecules including, for example, drugs, pesticides, herbicides and agents of war. See, Tenjarla et al., *J. Pharm. Sci.* 87: 425–429 (1998); Zughul et al., *Pharm. Dev. Technol.* 3: 43–53 (1998); and Albers et al., *Crit. Rev. Ther. Drug Carrier Syst.* 12: 311–337 (1995). Importantly, cyclodextrins are able to discriminate between enantiomers of compounds in their inclusion complexes. Thus, in one preferred embodiment, the invention provides for the detection of a particular enantiomer in a mixture of enantiomers. See, Koppenhoefer et al., *J. Chromatogr.*, A 793: 153–164 (1998).

The cyclodextrin recognition moiety can be attached to a SAM component, through a spacer arm or directly to the metal. See, Yamamoto et al., *J. Phys. Chem.* B 101: 6855–6860 (1997). Methods to attach cyclodextrins to other molecules are well known to those of skill in the chromatographic and pharmaceutical arts. See, Sreenivasan, K. J., *Appl. Polym. Sci.* 60: 2245–2249 (1996).

In a presently preferred embodiment, the recognition moiety is a polyaminocarboxylate chelating agent such as ethylenediaminetetraacetic acid (EDTA) or diethylenetriaminepentaacetic acid (DTPA). These recognition moieties can be attached to any amine-terminated component of a SAM or a spacer arm, for example, by utilizing the commercially available dianhydride (Aldrich Chemical Co., Milwaukee, Wis.).

In still further preferred embodiments, the recognition moiety is a biomolecule such as a protein, nucleic acid, peptide or an antibody. Biomolecules useful in practicing the present invention can be derived from any source. The biomolecules can be isolated from natural sources or can be produced by synthetic methods. Proteins can be natural proteins or mutated proteins. Mutations can be effected by chemical mutagenesis, site-directed mutagenesis or other means of inducing mutations known to those of skill in the art. Proteins useful in practicing the instant invention include, for example, enzymes, antigens, antibodies and receptors. Antibodies can be either polyclonal or monoclonal. Peptides and nucleic acids can be isolated from natural sources or can be wholly or partially synthetic in origin.

In those embodiments wherein the recognition moiety is a protein, for example an enzyme or antibody, the protein can be tethered to a SAM component or a spacer arm by any reactive peptide residue available on the surface of the protein. In preferred embodiments, the reactive groups are amines or carboxylates. In particularly preferred embodiments, the reactive groups are the $\epsilon$-amine groups of lysine residues. Furthermore, these molecules can be adsorbed onto the surface of the substrate or SAM by non-specific interactions (e.g., chemisorption, physisorption).

Recognition moieties which are antibodies can be used to recognize analytes which are proteins, peptides, nucleic acids, saccharides or small molecules such as drugs, herbicides, pesticides, industrial chemicals and agents of war. Methods of raising antibodies for specific molecules are well-known to those of skill in the art. See, U.S. Pat. No. 5,147,786, issued to Feng et al. on Sep. 15, 1992; U.S. Pat. No. 5,334,528, issued to Stanker et al. on Aug. 2, 1994; U.S. Pat. No. 5,686,237, issued to Al-Bayati, M.A.S. on Nov. 11, 1997; and U.S. Pat. No. 5,573,922, issued to Hoess et al. on Nov. 12, 1996. Methods for attaching antibodies to surfaces are also known in the art. See, Delamarche et al., *Langmuir* 12: 1944–1946 (1996).

G.1 Reactive Groups

"Reactive groups," as used herein refers to a subset of recognition moieties. The members of this subset can be used to attach recognition moieties to SAM components or metal films or, alternatively, they can themselves serve as recognition moieties. For example, an amine-bearing SAM component can be used to bind a carboxylic acid-containing recognition moiety onto the SAM, or it can be used to "recognize" a carboxylic, or other acid, in a solution, vapor and the like. One principle of recognition using reactive groups can be broadly stated: materials having electron deficient (e.g., electrophilic) organic layers can be used to recognize electron rich (e.g., nucleophilic) species and vice-versa. Moreover, acids can be used to recognize bases and vice versa.

The reactive groups can also be used to tether recognition groups onto the metal film or the organic layer before or after the organic layer has been deposited onto the metal layer. In certain circumstances, it will be desirable to assemble a batch of the particulate material having a reactive group on its surface. The material can be stored and aliquots can be used to bind recognition moieties as the materials are needed. Alternatively, aliquots of the material can each be reacted with a different recognition moiety to, for example, screen or assemble a library of compounds. Many other variations of and uses for this strategy will be readily apparent to those of skill in the art. The nature of useful reactive groups is discussed in greater detail below.

The reactive functional groups can be chosen such that they do not participate in, or interfere with, the reaction controlling the attachment of the functionalized SAM component onto the substrate's surface. Alternatively, the reactive functional group can be protected from participating in the reaction by the presence of a protecting group. Those of skill in the art will understand how to protect a particular functional group from interfering with a chosen set of reaction conditions. For examples of useful protecting groups, see Greene et al., PROTECTIVE GROUPS IN ORGANIC SYNTHESIS, John Wiley & Sons, New York, 1991.

The discussion which follows focuses on the attachment of a reactive SAM component to the substrate surface. This focus is for convenience only and one of skill in the art will understand that the discussion is equally applicable to embodiments in which the SAM component-recognition moiety is preformed prior to its attachment to the substrate. As used herein, "reactive SAM components" refers to components that have a functional group available for reaction with a recognition moiety or other species following the attachment of the component to the substrate.

Currently favored classes of reactions available with reactive SAM components are those which proceed under relatively mild conditions. These include, but are not limited to nucleophilic substitutions (e.g., reactions of amines and alcohols with acyl halides), electrophilic substitutions (e.g., enamine reactions) and additions to carbon-carbon and carbon-heteroatom multiple bonds (e.g., Michael reaction, Diels-Alder addition). These and other useful reactions are discussed in March, ADVANCED ORGANIC CHEMISTRY, Third Ed., John Wiley & Sons, New York, 1985.

According to the present invention, a particle's surface can be functionalized with SAM components and other species by attaching a reactive SAM component to the substrate surface in such a way as to derivatize the substrate surface with a plurality of available reactive functional groups. Reactive groups which can be used in practicing the present invention include, for example, amines, hydroxyl groups, carboxylic acids, carboxylic acid derivatives, alkenes, sulfhydryls, etc.

In a preferred embodiment, the reactive group is tethered to the metal surface by an agent displaying avidity for that surface. In a presently preferred embodiment, the substrate includes a silver film or a gold film and the group which reacts with the metal surface comprises a thiol, sulfide or disulfide such as:

$$Y—S—R^1—X^1 \qquad (I)$$

wherein $R^1$ is a linking group between sulfur and $X^1$ and $X^1$ is a reactive group or a protected reactive group. $X^1$ can also be a recognition moiety as discussed below. Y is a member selected from the group consisting of H, $R^2$ and $R^2$—S—, wherein $R^1$ and $R^2$ are independently selected. When $R^1$ and $R^2$ are the same, symmetrical sulfides and disulfides result, and when they are different, asymmetrical sulfides and disulfides result.

A large number of functionalized thiols, sulfides and disulfides are commercially available (Aldrich Chemical Co., St. Louis). Additionally, those of skill in the art have available to them a manifold of synthetic routes with which to produce additional such molecules. For example, amine-functionalized thiols can be produced from the corresponding halo-amines, halo-carboxylic acids, etc. by reaction of these halo precursors with sodium sulfhydride. See, for example, Reid, ORGANIC CHEMISTRY OF BIVALENT SULFUR, vol. 1, pp. 21–29, 32–35, vol. 5, pp. 27–34, Chemical Publishing Co., New York, 1958, 1963. Additionally, functionalized sulfides can be prepared via alkylthio-dehalogenation with a mercaptan salt. See, Reid, ORGANIC CHEMISTRY OF BIVALENT SULFUR, vol. 2, pp. 16–21, 24–29, vol. 3, pp. 11–14, Chemical Publishing Co., New York, 1960. Other methods for producing compounds useful in practicing the present invention will be apparent to those of skill in the art.

Many reactive groups and protected reactive groups of use in the present invention will be apparent to those of skill in the art. One of skill will be able to ascertain and purchase or synthesize the reactive organic layer constituent needed for a particular purpose. Representative reactive functional groups ($X^1$) include, but are not limited to:

(a) carboxyl groups and various derivatives thereof including, but not limited to, N-hydroxysuccinimide esters, N-hydroxybenztriazole esters, acid halides, acyl imidazoles, thioesters, p-nitrophenyl esters, alkyl, alkenyl, alkynyl and aromatic esters;

(b) hydroxyl groups which can be converted to esters, ethers, aldehydes, etc.

(c) haloalkyl groups wherein the halide can be later displaced with a nucleophilic group such as, for example, an amine, a carboxylate anion, thiol anion, carbanion, or an alkoxide ion, thereby resulting in the covalent attachment of a new group at the site of the halogen atom;

(d) dienophile groups which are capable of participating in Diels-Alder reactions such as, for example, maleimido groups;

(e) aldehyde or ketone groups such that subsequent derivatization is possible via formation of carbonyl derivatives such as, for example, imines, hydrazones, semicarbazones or oximes, or via such mechanisms as Grignard addition or alkyllithium addition;

(f) sulfonyl halide groups for subsequent reaction with amines, for example, to form sulfonamides;

(g) thiol groups which can be converted to disulfides or reacted with acyl halides;

(h) amine or sulfhydryl groups which can be, for example, acylated or alkylated;

(i) alkenes which can undergo, for example, cycloadditions, acylation, Michael addition, etc.; and (j) epoxides which can react with, for example, amines and hydroxyl compounds.

In addition to there being a broad spectrum of reactive groups that can be incorporated into surfaces studied using the present invention, many methods and reaction sequences known in the art are appropriate for use in elaborating reactive groups by their conjugation with other recognition moieties.

H. Conjugation

A recognition moiety can be conjugated to a metal film or component of a SAM by any of a large number of art-known attachment methods. In one preferred embodiment, a reactive SAM component is attached to the substrate and the recognition moiety is subsequently bound to the SAM component via the reactive group on the SAM component and a group of complementary reactivity on the recognition moiety. See, for example, Hegner et al., *Biophys. J.* 70: 2052–2066 (1996). In another preferred embodiment, the recognition moiety is attached to the SAM component prior to immobilizing the SAM component on the substrate surface: the recognition moiety-SAM component cassette is then attached to the substrate. In a still further preferred embodiment, the recognition moiety is attached to the substrate via a displacement reaction. In this embodiment, the SAM is preformed and then a fraction of the SAM components are displaced by a recognition moiety or a SAM component bearing a recognition moiety.

Peptides and nucleic acids can be attached to a metal film or a SAM component. Both naturally-derived and synthetic peptides and nucleic acids are of use in conjunction with the present invention. These molecules can be attached to a SAM component by any available reactive group. For example, peptides can be attached through an amine, carboxyl, sulfhydryl, or hydroxyl group. Such a group can reside at a peptide terminus or at a site internal to the peptide chain. Nucleic acids can be attached through a reactive group on a base (e.g., exocyclic amine) or an available hydroxyl group on a sugar moiety (e.g., 3'- or 5'-hydroxyl). The peptide and nucleic acid chains can be further derivatized at one or more sites to allow for the attachment of appropriate reactive groups onto the chain. See, Chrisey et al., *Nucleic Acids Res.* 24: 3031–3039 (1996).

When the peptide or nucleic acid is a fully or partially synthetic molecule, a reactive group or masked reactive group can be incorporated during the process of the synthesis. Many derivatized monomers appropriate for reactive group incorporation in both peptides and nucleic acids are know to those of skill in the art. See, for example, "Special Methods in Peptide Synthesis," In, THE PEPTIDES: ANALYSIS, SYNTHESIS, BIOLOGY, Vol.2: Gross, et al., Eds., Academic Press, New York (1980). Many useful monomers are commercially available (Bachem, Sigma, etc.). This masked group can then be unmasked following the synthesis, at which time it becomes available for reaction with a SAM component or a spacer arm.

In other preferred embodiments, the peptide is attached directly to the metal film. See, Frey et al. *Anal. Chem.* 68: 3187–3193 (1996). In a particularly preferred embodiment, the peptide is attached to a silver or a gold film through a sulfhydryl group on a cysteine residue. In another preferred embodiment, the peptide is attached through a thiol to a spacer arm which terminates in, for example, an iodoacetamide, chloroacetamide, benzyl iodide, benzyl bromide, alkyl iodide or alkyl bromide. Similar immobilization techniques are known to those of skill in the art. See, for example, Zull et al., *J. Ind. Microbiol.* 13: 137–143 (1994).

I. Spacer Arms

As used herein, the term "spacer arm," refers to constituents of an organic layer that have a different structure than the bulk of the organic layer and which bear either reactive groups, recognition moieties or combinations thereof.

In certain embodiments, it is advantageous to have the recognition moiety attached to a SAM component having a structure that is different than that of the constituents of the bulk SAM. In this embodiment, the group to which the recognition moiety is bound is referred to as a "spacer arm" or "spacer." Using such spacer arms, the properties of the SAM adjacent to the reactive group and/or recognition moiety can be controlled. Properties that are usefully controlled include, for example, hydrophobicity, hydrophilicity, surface-activity and the distance of the reactive group and/or recognition moiety from the surface of the substrate and/or the SAM. For example, in a SAM composed of alkanethiols, the recognition moiety can be attached to the metal film or a SAM component via an amine terminated poly (ethyleneglycol). Numerous other combinations of spacer arms and SAMs will be apparent, and are accessible, to those of skill in the art.

In addition to the use of hydrophilic polymers, the hydrophilicity of the organic layer can be enhanced by reaction with polar molecules such as amine-, hydroxyl- and polyhydroxyl-containing molecules. Similar strategies can be used to increase hydrophobicity (e.g., use of long-chain fatty acid derivatives) and to enhance the surface activity of the material (e.g., use of detergents, surfactants).

In another embodiment, the spacer serves to distance the reactive group and/or recognition moiety from the substrate or SAM. Spacers with this characteristic have several uses. For example, a recognition moiety held too closely to the substrate or SAM surface may not react with incoming analyte, or it may react unacceptably slowly. When an analyte is itself sterically demanding, the reaction leading to recognition moiety-analyte complex formation can be undesirably slowed, or not occur at all, due to the monolithic substrate hindering the approach of the two components.

The materials, methods and devices of the present invention are further illustrated by the examples which follow. These examples are offered to illustrate, but not to limit the claimed invention.

EXAMPLES

Example 1 illustrates the preparation of the glass substrates, the oblique deposition of a gold film onto the glass slides and the AFM imaging of the obliquely deposited gold film. The results of visual examination of the images are also discussed Example 2 provides a method for analyzing the contour of obliquely deposited metal films such as those provided in Example 1.

Example 3 provides a method for analyzing the curvature of obliquely deposited gold films such as those provided in Example 1.

Example 4 provides a method for estimating the anchoring energy of a mesogenic layer on an obliquely deposited gold film.

Example 5 provides experimental confirmation of the calculational method provided in Example 4. The minimum thickness of a liquid crystal cell able to support a 90° twist deformation is examined.

Example 6 provides a method for analyzing the changes in roughness and anisotropy of a gold films caused by adsorption of molecules to the surface of the film.

Example 7 provides a method utilizing AFM for predicting the response of a LC placed on an obliquely deposited film of gold to a recognition event taking place on the surface of the gold film.

Example 1

1.1 Materials and Methods
1.1a Preparation of Glass Substrates

Surfaces of a variety of glass microscope slides were investigated by AFM. The surfaces of the slides were frequently covered by a soft film (a few nanometers in thickness), parts of which could be easily moved by imaging the surface in "contact mode." To minimize the extent of formation of this layer on the surface, all glass slides were stored in a dry vacuum desiccator. Cleaning procedures based on "piranha solution" (Drawhorn et al., *J. Phys. Chem.* 45: 99, 16511 (1995)) alone were not effective in removing this film from the surface of the glass slide. Thus, the following procedure was developed:

(a) Acid Bath: Glass microscope slides, Fishers' Finest Premium Grade (Fisher Scientific, Pittsburgh, Pa.) were immersed in a piranha [70:30 (% v/v) $H_2SO_4$:$H_2O_2$ (30%)] bath at 60–80° C. for at least 1 hour. Nitrogen gas was sparged through the solution to provide agitation;

(b) Water Rinse: After the glass slides were removed from the acid bath, the slides were rinsed in running 18 Mohm $H_2O$ for at least 2 minutes;

(c) Base Bath: Immediately following the rinse, the slides were immersed in a base [80:20 (% v/v) KOH: 2 M $H_2O_2$] solution (with $N_2$ agitation) and heated to between 60–80° C. for at least 1 hour;

(d) Water Rinse: The slides were again thoroughly rinsed under 18 Mohm water for 2 minutes;

(e) Ethanol Rinse: $H_2O$ was drained from the surface of the slides. The slides were then rinsed with ethanol several times without permitting the surface of the slide to dry in the air.

(f) Methanol Rinse: The ethanol was drained and methanol used for the final 3 rinse cycles.

(g) Initial Drying: The methanol was drained and the slides were immediately dried with a $N_2$ gun for no less than 2 minutes.

(h) Primary Baking: The slides were placed in a oven at 90° C. for a minimum of 12 hours (but typically not longer than 72 hours). The slides were removed when ready to be transported to a vacuum oven.

(i) Final Baking: The slides were placed in a vacuum oven and baked under vacuum for a minimum of 2 hours at 150–200 ° C. During the cooling cycle, the oven was purged with dry $N_2$.

(j) Deposition chamber: After the slides had cooled (but still in the vacuum oven with a positive $N_2$ flow) they were removed and immediately placed in the vacuum chamber of the evaporator. The chamber was rapidly pumped down to <0.1 Torr and then purged with $N_2$ to approximately ~700 Torr to facilitate the removal of water vapor from the chamber. The chamber was then pump down to a maximum pressure of $3 \times 10^{-6}$ Torr before deposition of the metal films commenced.

1.1b Electron-Beam Deposition of Metals

Metal films were evaporated onto clean glass substrates with an electron beam evaporator (model SEC600, CHA Industries, Fremont) in a class 100 cleanroom. Between each evaporation, the titanium (99.999%) and gold (99.999%) sources were removed from the chamber (International Advanced Materials, New York). A thin film (~1 nm) of titanium was deposited to promote adhesion between the gold (thickness 10 nm) and glass substrates.

Prior to putting the gold source into the chamber, the source was visually inspected for unusual surface characteristics (shine, crystallites, etc.). Prior to evaporation of the metals, both metal sources were preheated to uniformly melt the surface of the gold and expel surface contaminants (with the deposition shutter closed). Visual inspection during preheating and deposition was used to determine whether the gold source needed to be cleaned. A "slag" of small particles was generally observed to form on the surface of the melt after 10–30 depositions. When a slag was observed, the source was cleaned by immersion (minimum of 3 cycles, each of 15 minutes) in aqua regia [20:80 (% v/v) HCl:$HNO_3$] and piranha solution at 90 ° C. The cleaning was continued until the Au source resumed its "brilliant" appearance. After each evaporation, the titanium and gold sources were removed from the chamber.

Prior to depositing a metal film, the chamber was visually inspected, vacuumed and wiped clean with a lint free cleanroom cloth. During deposition, all parameters indicative of the state of the evaporator were noted (pressures, appearances of metals, and rate of deposition). Typical initial pressures were <3×10–6 Torr. During deposition of the gold, the pressure was observed not to rise above 4×10–6 Torr. The rate of deposition was controlled by a microbalance QCM feedback controller and was set at 0.02 mm/s. The maximum deviation in the rate of deposition was observed at the start of the deposition (for ~3 secs): the rate was always <0.04 nm/s. During deposition of the gold, variations in the rate of deposition of the metal were not measurable (<0.01 nm/s). The thickness of the film was calculated from the value deposited on the QCM and adjusted for the oblique angle of deposition and the position of the slides in the vacuum chamber of the evaporator.

Figure 1:
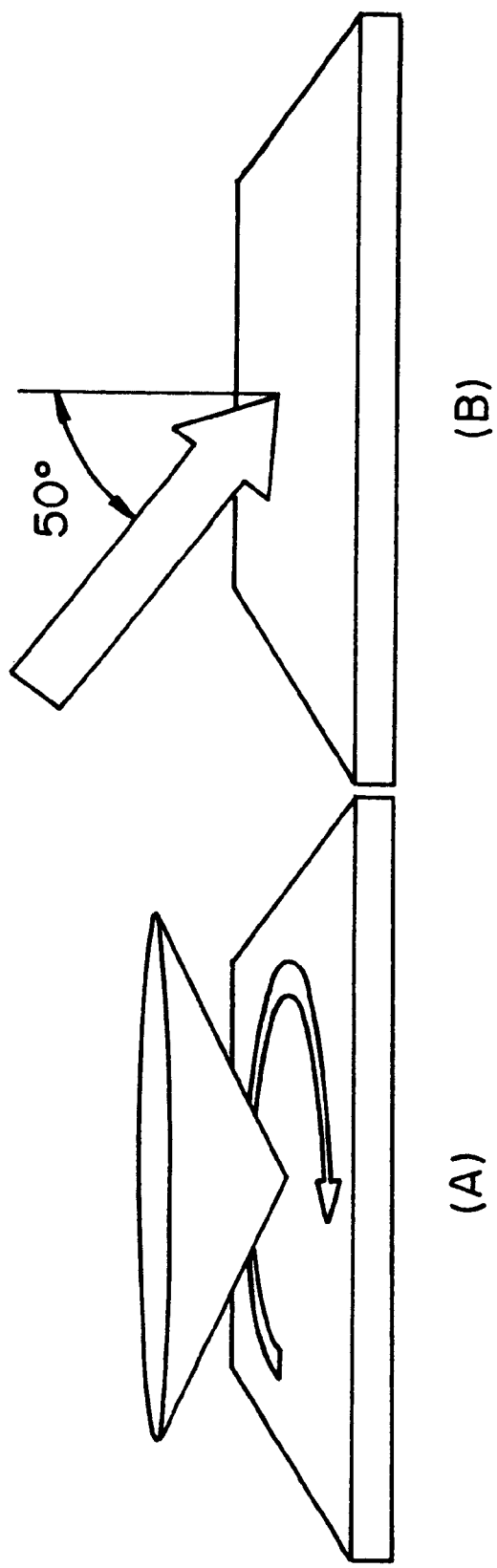
FIG. 1. Schematic illustration of the deposition of films of gold:
  (A) Uniformly deposited films of gold prepared by changing the azimuthal and polar angles of incidence of the gold vapor during deposition. The cone contains the set of all vectors that represent the direction of incidence of the gold vapor;
  (B) Obliquely deposited films of gold. The sample is stationary during the oblique deposition. The gold is deposited onto the substrate from a unique direction and at an angle of incidence of 50° from the normal of the surface of the substrate.

Obliquely deposited films of gold were prepared by holding the glass substrates stationary during deposition of the gold (FIG. 1B). The incident vapor was deposited at an angle of 50 degrees measured from the normal of the slide. The preferred direction of deposition of the metal leads to the creation of structural anisotropy within the metal film (see below). A principal cause of anisotropy within obliquely deposited metal films is believed to be self-shadowing of the incident metal vapor. See, van Kranenburg et al., *Mater. Sci., Engr.* R11: 295 (1994). In contrast, so-called "uniformly deposited films of gold" were prepared by varying both the polar and azimuthal angles of incidence of the gold onto the substrate during the evaporation (FIG. 1A). The motion of the slides is controlled by their mounting on a planetary that rotates with an epicyclical motion about the vertical axis of the evaporator. Due to the motion of the substrate, the gold is deposited onto the substrate without a preferred direction (and thus no structural anisotropy forms within the gold film).

Immediately following the removal of the metal films from the evaporator, AFM analyses were performed on at least one sample from each batch of slides. The AFM analysis was used to screen for the presence of defects or debris (>100 nm) on the surface of the film. Typically no debris or defects were observed within an area with lateral dimensions of 5 µm. Samples showing defects/debris within 5 µm×5 µm areas will generally lead to erroneous analyses (as described below). Following each deposition, the orientations of bulk LCs supported on SAMs formed on the gold films were measured. Past results were confirmed by using a polarized light microscope with a quarter wave plate (BX60, Olympus). See, Drawhorn et al., *J. Phys. Chem.* 99:16511 (1995); Gupta et al., *Science* 279: 2077 (1998). Samples of gold that did not pass the two tests described above were not further investigated. With the cleaning and deposition procedures reported above, however, almost all depositions were successful (>90%).

1.1c Atomic Force Microscopy

AFM was used to characterize the nanometer-scale structure of the gold films, (although STM was also performed with results similar to those described herein).

The AFM used in this study was a Nanoscope III (Digital Instruments, Santa Barbara). All samples were scanned in ambient conditions using "contact mode" and an E scanning head (~15 µm maximum scan size). In order to obtain AFM images of sufficient quality/reproducibility that they could be used for quantitative analyses of the anisotropy within the gold films, the following procedures were used:

(a) Sample preparation: Gold samples were imaged within 6 hours of deposition, and stored in either a dry desiccator or a dry vacuum desiccator. Each sample was immediately moved to the AFM after removal of the sample from the desiccator or after formation of the SAM. Each sample was glued to a steel puck in order to minimize drift sometimes observed when gold films were mounted on steel pucks using double-sided tape. The sample was aligned on the scanning piezo using either the parallel or perpendicular wall of the laser head as a reference with which to align an edge of the sample. No other method of aligning samples was found to be practical due to the confined space in the head of the AFM.

(b) Imaging: The base unit of the AFM was left "on" in order to maintain the unit at a constant temperature.

The piezos and laser head were stored in a dry environment and allowed to "warm up" for at least 1 hour before samples were placed on the piezo. The surface was engaged by the AFM controller with a photodetector setpoint bias of 1.5 V to provide a mid-range force during contact. The exact value of the force appeared not to be important. The integral and proportional gains were typically set at 3 and 9, respectively: the gains were sufficient to record visually crisp images but low enough to avoid the presence of oscillations in the images. The presence of oscillations was easily checked by observing the cross-section plots in real-time. The size of the initial scan was 5 µm. If debris were visible in any of several scans of the surface, the sample was discarded. Since adopting the procedures described above for the preparation of the samples, no samples have been discarded. Following the survey scan, the scan size was reduced to 1 µm. During this scan, the condition of the AFM tip was assessed. Any tips producing artifacts (e.g., double images, caused by twin tips or strikingly similar shapes, caused by tip convolution) were removed and discarded. The size of the scan was then reduced to 350 mn: if the resulting scans were not "crisp", the tip was discarded. Otherwise, the images were captured. After capturing several images, the tip was disengaged. The sample was then physically rotated 90°, and the process described above repeated. As described below, the samples were physically rotated so as to test for apparent anisotropy within the images that might be caused by the direction of rastering of the tip across the surface.

Because the rastering motion of an AFM tip can introduce artifacts into images (e.g., due to finite response times of the feedback controller and different piezo sensitivities of the X and Y directions), the obliquely deposited gold film shown in FIG. 2A was also imaged with the scanning direction of the AFM head perpendicular to the direction of deposition of the gold. This image is shown in FIG. 2C image and was obtained by physically rotating the sample under the AFM head (see Methods section). No samples were "rotated" by changing the angle of the scan.

All images were flattened by using the AFM software which corrects for any large tilt of the sample with respect to the AFM. No other filtering of the images was performed. Images analyzed (as described below) before flattening were found to show the same level of anisotropy as non-flattened images. Flattening does, however, improve the visual appearance of the images. All Fourier analyses were performed on raw (non-flattened) images. Furthermore, we used raw data obtained in the direction of scanning (x-axis) to obtain the Fourier spectrum of the surface and thus calculate the elastic energy density of a supported LC. This approach required that the sample be physically rotated by 90° so as to obtain the one dimensional Fourier spectra in orthogonal directions on the surface. The AFM was found to produce artificial high frequency noise in the direction orthogonal to the scanning (y-axis or slow scanning axis) direction, and all profiles obtained in this direction were found to exhibit large power spectrum amplitudes at large wavevectors. The power spectra obtained from the profiles measured in the x-direction were found to be reproducible.

1.2 Results 1.2a Visual Inspection of Real Space and Fourier Images

Figure 2:
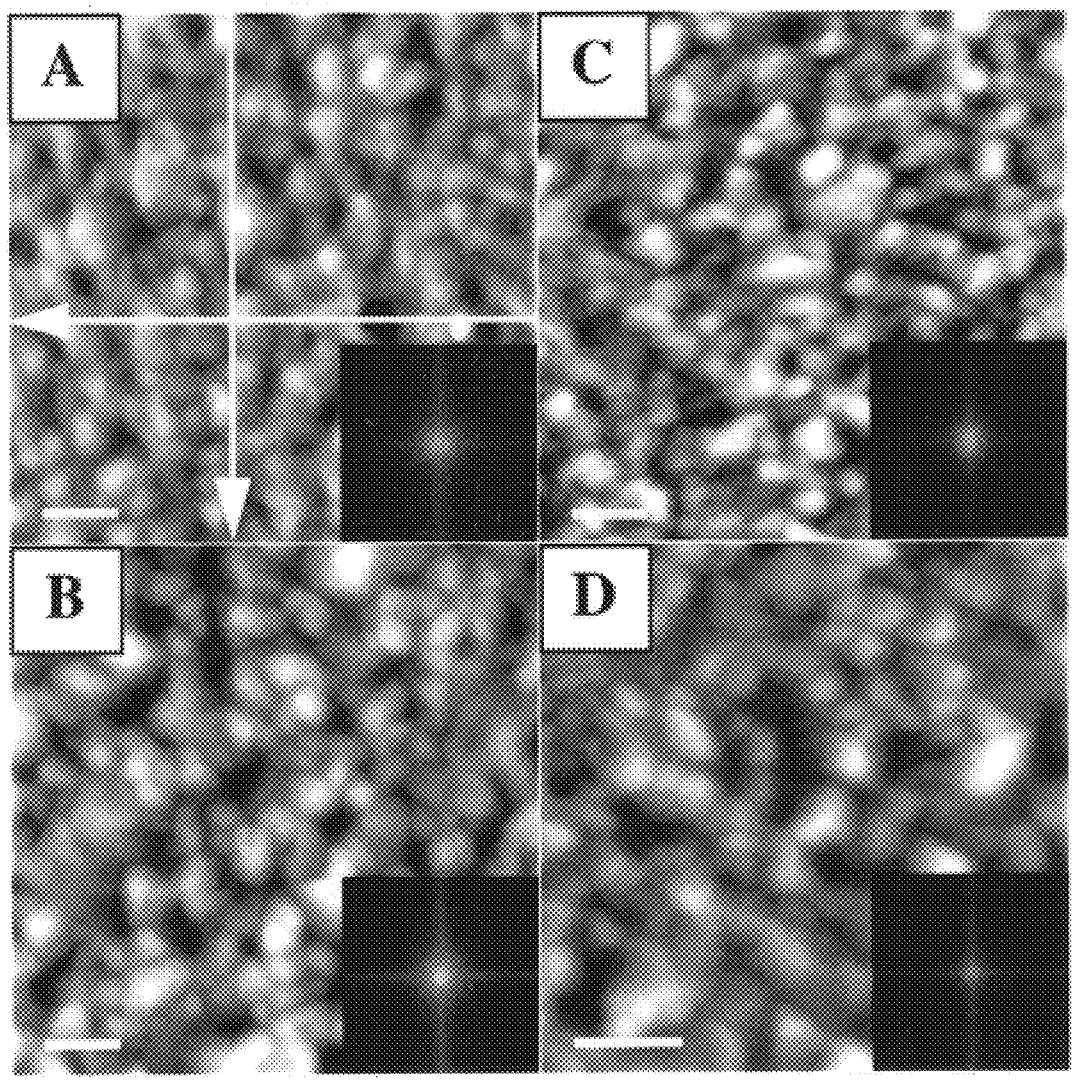
FIG. 2. Images of gold films (10 nm of Au on ~1 nm of Ti) obtained by AFM. The insets are fast Fourier transforms of the real space images. The gray scale of contrast in the real space images corresponds to a variation in height (z-axis) of 8 nm. The horizontal scale bar in each image represents a lateral dimension of 50 nm. The scanning direction is horizontal in each:
  (A) 350 nm×350 nm image of an obliquely deposited film of gold with direction of deposition parallel to the scan direction;
  (B) 350 nm×350 nm scan of a film of gold deposited uniformly;
  (C) 350 nm×350 nm image of an obliquely deposited film of gold with the direction of deposition perpendicular to the scan direction;
  (D) 250 nm×250 nm image of an obliquely deposited film of gold with a direction of deposition that is parallel to the scan direction.

FIG. 2 shows real-space AFM images of obliquely deposited and uniformly deposited films of gold having thicknesses of 10 nm. In all these images, the horizontal axis corresponds to the "scanning direction" of the AFM, that is the fast axis (also noted as the x-axis) of the AFM head when imaging.

Figure 3:
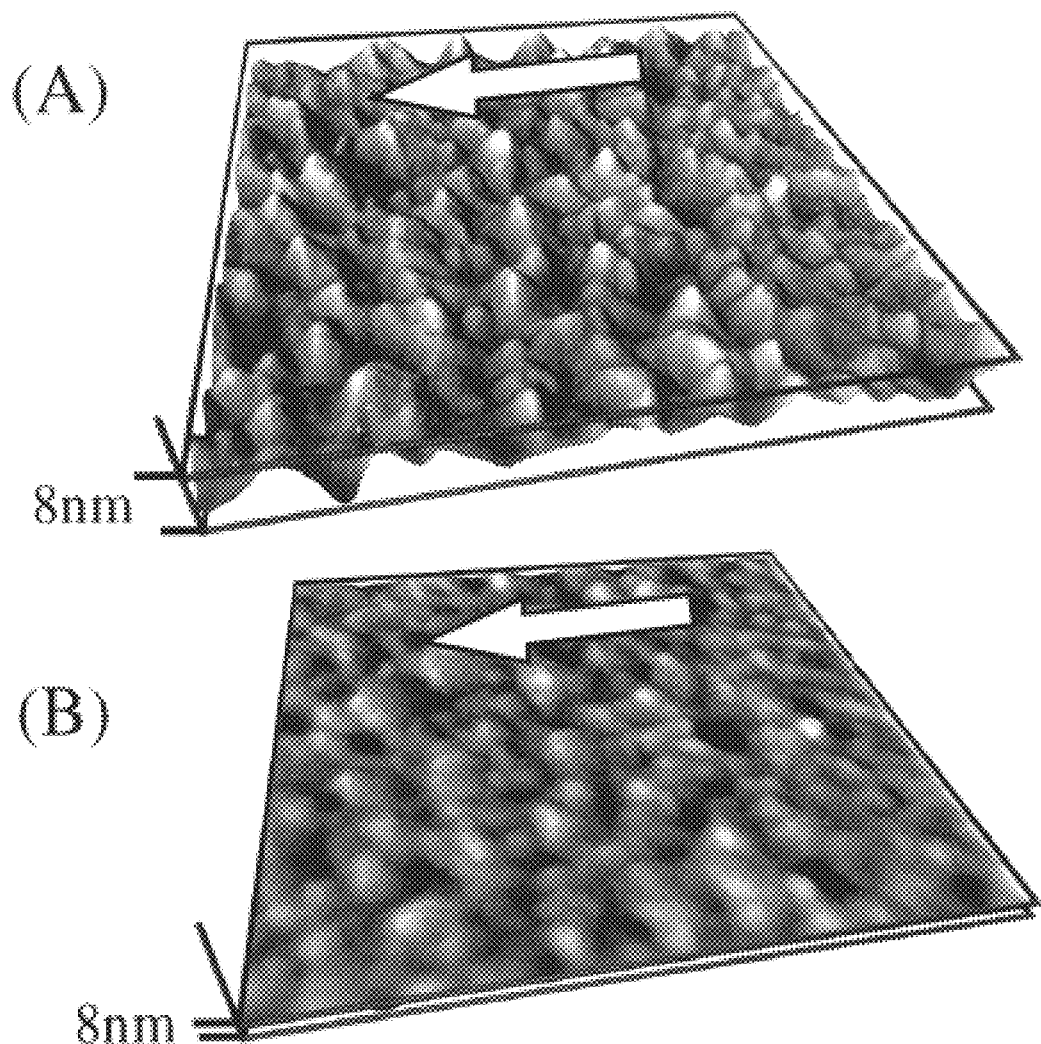
FIG. 3. Three dimensional plots of images of gold films shown in FIG. 2A. The white arrow indicates the direction of deposition of the gold film:
  (A) The vertical scale bar corresponds to a height of 16 nm (expanded z-scale)

FIG. 2A is an image of an obliquely deposited film of gold with lateral dimensions of 350 nm×350 nm. The scanning direction is parallel to the direction of deposition of the gold in FIG. 2A. Inspection of this image shows the surface of the gold film to be "pebbly" in nature, with a grain sizes ranging from approximately 10 nm to 40 nm. The pebbly nature of the surface can be easily visualized in the three-dimensional plots shown in FIG. 3. FIG. 3A has a magnified scale in the z-direction (by a factor of 4) relative to lateral dimension. The expanded z-scale provides a better (although exaggerated) view of the pebble-like texture of the film. FIG. 3B, in contrast shows the three-dimensional plot with lateral and vertical scales that are approximately equal (the vertical scale bar is 64 nm). From FIG. 3B, it is apparent that these films are relatively flat (see below, for a quantitative statement), with heights ranging approximately ±2 nm over most of the image.

Inspection of the images in FIG. 2A and FIG. 3 shows these gold films to be largely continuous with the exception of a few holes (dark spots) found in each square micrometer of the surface: these holes have diameters of ~20 nm and depths comparable to the thickness of the gold film (~10 nm) (see, FIG. 4). X-ray photoelectron spectroscopy detected no evidence of Ti (or oxides of Ti or Si at the surface). Other dark regions observed in the AFM images were only about ~4 nm deep, indicating that the films are likely to be continuous in these areas. These shallow pits are seen in all images (A–D) in FIG. 2.

FIG. 4 compares cross-sectional profiles obtained in orthogonal directions from FIG. 2A (indicated by horizontal and vertical lines in FIG. 2A). These cross-sectional profiles present no obvious differences in roughness between the cross-sections measured in directions parallel and perpendicular to the directions of deposition, except for the high-frequency noise that is always present in the slow scanning direction. Similarly, visual inspection of the images and profiles in FIGS. 2A, 3 and 4 does not reveal an obvious structural anisotropy within these obliquely deposited films of gold. Nor does visual inspection of Fourier space images (wavelengths ranging from the sample scan size to approximately 1 nm) reveal anisotropy within these films. In contrast, the quantitative methods of image analysis described in the examples below do consistently reveal the presence of an anisotropic roughness within these films.

FIG. 2B shows an image of a gold film (10 nm in thickness) that was not deposited with a preferred direction (so-called uniformly deposited gold film). A visual comparison of the films of gold shown in FIGS. 2A and 2B show only subtle differences. The apparent size of the gold grains in FIG. 2B are slightly larger than those shown in FIG. 2A. Only by quantitative analysis can anisotropy be detected in FIG. 2A and not FIG. 2B.

Because the rastering motion of an AFM tip can introduce artifacts into images (e.g., due to finite response times of the feedback controller and different piezo sensitivities of the x- and y-directions), the obliquely deposited gold shown in FIG. 2A was also imaged with the scanning direction of the AFM head perpendicular to the direction of the deposition of the gold. This image is shown in FIG. 2C and was obtained by physically rotating the sample under the AFM head (see methods section). The piezos were not used to change the direction of scanning of the AFM tip across the gold films because a change in the direction of scanning using the piezos can change the level of high-frequency noise caused by the feedback control of the AFM and, thus, create apparent anisotropy in the images. Following rotation of the sample, the slight elongation of gold grains in the vertical direction in FIG. 2A (perpendicular to the direction of deposition of the gold) appears to move to the horizontal direction of the image shown in FIG. 2C. This result suggests that the apparent discernible elongation of grains was not due to drift of the sample during rastering of the AFM head. Whereas FIG. 2A shows evidence of the slight elongation of the gold grains in the vertical direction of the image (perpendicular to the direction of deposition of the gold), FIG. 2C shows evidence of a slight elongation in the horizontal direction of the image. This elongation of grains was not due to drift of the sample during rastering of the AFM head because, when present, the elongation was always measured to be in a direction that was perpendicular to direction of deposition of the gold. Past studies of obliquely deposited metals have reported elongated grains to form in a direction that is perpendicular to the plane of deposition of the metal. (van Kranenburg, et al, *Mat. Sci. & Engr.* 7: R11, 295 (1994); Smith, D. L. THIN-FILM DEPOSITION: PRINCIPLES & PRACTICE; McGraw-Hill, Inc.: New York (1995).)

FIG. 2D is a 250 nm×250 nm image of an obliquely deposited film of gold, oriented during imaging with the direction of deposition of the gold parallel to the scan direction. This image shows the same qualitative features seen at lower resolution (FIG. 2A). FIG. 2D is analyzed quantitatively below.

Example 2

As described in Example 1, visual inspection of AFM images shown in FIGS. 2–4 does not reveal an obvious difference between the structures of obliquely and uniformly deposited films of gold (or an obvious difference between the structure of obliquely deposited gold films characterized in directions parallel and perpendicular to the direction of deposition). Quantitative analyses of the topography of these films was utilized in order to unambiguously identify the existence of structural anisotropy within obliquely deposited films of gold. The first of these analyses is based on a measure of the contour length of cross-sectional profiles of the gold films.

This method of analysis was chosen for three reasons. First, it is simple to perform. Second, measurement of the contour length at different wavelengths and azimuthal orientations (measured with respect to the direction of deposition of the gold) makes possible identification of the characteristic spatial scales on which anisotropy exists within the films of gold. Third, because the contour length is related to average of the square of the local slope of a surface (see below), it forms an intuitively useful index of the nature of a surface. Measurements of contour lengths have been used in the past to obtain the fractal dimensions of metal oxide films (Vernier et al., *J. Vac. Sci. Tech.* A 3: 9, 563 (1991); Barberi et al., *Phys. Lett.* A. 213: 293 (1996); Barberi et al., *J. Phys.: Condens. Matt.* 6: A275 (1994)).

2.1 Materials and Methods

The following procedure was used to determine the contour length from AFM images of thin films of gold. First, the AFM images were exported as 512×512 matrices. Each element of the matrix represented the height of a point on the surface. Each matrix was read into a FORTRAN program that calculated the square of the distance between points of heights $z_i$ and $z_{i+\lambda}$ A separated by a horizontal distance $\lambda$ in a chosen azimuthal direction:

$$cont_{i,\lambda}^2 = \frac{(z_{i+\lambda} - z_i)^2 + \lambda^2}{\lambda^2} \quad (1)$$

From the above equation, the relationship between the local slope of the surface $(z_i - z_{i+\lambda})/\lambda$ and the contour length is apparent. The average of the square of the contour length was calculated for a family of cross-sectional profiles obtained from an AFM image, except for those regions of the image near its edge (see below), $$\overline{cont_\lambda^2} = \sum_i \frac{cont_{i,\lambda}^2}{n} \quad (2)$$

The square root of Equation 2 is the RMS contour length of the surface and was calculated from each image for different wavelengths ($\lambda$) and azimuthal sampling orientations. When sampling azimuthal orientations not at 0 or 90 degrees (measured from a vector parallel to the direction of deposition of the gold), a simple linear interpolation was used to determine the height of sampling points that fell between actual data points in the AFM image. The use of the linear interpolation did not introduce a significant error into our analysis because the minimum wavelength of sampling always covered several experimental data points. Note that the contour length is dimensionless since the measurement is the topological distance traversed while moving a lateral distance of 1 nm.

A number of precautions were needed in order reach reliable conclusions based on a contour analysis. First, the minimum wavelength used in the analysis (~4 nm) corresponded to a minimum spacing of ~6 pixels for a 350 nm×350 nm image with 512×512 data points. This minimized the introduction of artifactual roughness seen at <3 pixel spacings due to inherent feedback oscillations of the AFM. Second, as mentioned above, any pixels near the edges of the image (within ~10 pixels of the edge of the image) were excluded from the analysis, since the primary noise due to feedback and the reversal of the tip direction occurs at the edges of a scan. Third, the rastering of the AFM tip introduces an artifactual contribution to the roughness of the surface at orientations perpendicular to the scan direction. Due to this artificial roughness at orientations perpendicular to the scan direction, the sample was physically rotated to determine if the noise was affecting the contour length calculations. If noticeable differences were seen in the contour analyses between the initial sample orientation and the physically rotated orientation, then the data were discarded. Fourth, the AFM was operated with feedback settings that were sufficiently low to reduce oscillations in the image (visually seen near the edges of the scan) but high enough to accurately represent the surface, as previously noted in the AFM methods section.

2.2 Results

FIG. 5 shows the results of a contour length analysis of the real space images shown in FIG. 2. The y-axis represents the dimensionless contour length and the x-axis corresponds to the azimuthal orientation of the contour measured with respect to the direction of scanning (horizontal axis of images in FIG. 2). In each panel of FIG. 5, contour lengths are reported for values of $\lambda$ of 4 nm, 8 nm, 12 nm, 20 nm and 40 nm. In addition, on the ordinate axis on the righthand side of the plots in FIG. 5 shows the average (rms) slope of the surface (reported as an angle of the inclination measured from the horizontal).

FIG. 5A shows the contour lengths and RMS slope of the obliquely deposited films of gold shown in FIG. 2A: this film was imaged with the deposition direction parallel to the scanning direction. The contour analysis does show anisotropy within this film: the contour length parallel to the direction of deposition of the gold (0–10°) is greater than the contour length perpendicular to it (90–100°). The ~10° displacement of the minimum from 90° is likely caused by uncertainly in the orientation of the sample within the AFM. These results indicate that the RMS slope of the gold film (see right axis on FIG. 5) is greater when measured parallel to the direction of deposition of the gold (by ~1°). These results also demonstrate that the anisotropy decays with increasing wavelength of sampling ($\lambda$).

Anisotropy was not measured when the sample wavelength was greater than °20 nm (see below). The loss of anisotropy at wavelengths >20 nm indicates that the anisotropic structure within the surface exists at spatial scales comparable to or smaller than the sizes of the grains of gold within the film: this conclusion suggests the presence of elongated grains of gold having a long axis in a direction perpendicular to the direction of deposition of the gold.

FIG. 5B shows a contour analysis of an obliquely deposited gold film shown in FIG. 2C. Because this sample was imaged with the scan direction perpendicular to the direction of deposition of the gold, if scan artifacts are absent in our analysis, the contour analysis should yield results identical to FIG. 5A shift in phase by 90°. This is indeed observed. Again the measured contour length is greatest in a direction parallel to the direction of deposition of the gold and the anisotropy is observed to decay with increasing wavelength.

FIG. 5C shows a family of contour lengths obtained using the uniformly deposited film of gold shown in FIG. 2B. In comparison to the obliquely deposited film, the uniform film shows little anisotropy. The cause of the slight anisotropy in the uniformly deposited films is unknown. The azimuthal locations of the minimum and maximum were found to vary when a uniformly deposited gold film was characterized in different locations on the sample. The average contour lengths of the uniformly deposited gold films were typically found to lie between the maximum and minimum contour lengths of the obliquely films.

When using the images in FIGS. 2A–C, it was not possible to measure the contour lengths using sampling wavelengths smaller than 4 nm because pixelation within these images introduced noise into the contour analysis. Higher resolutions images were found to be necessary in order to evaluate contour lengths at shorter wavelengths. FIG. 2D is a 250 nm×250 nm image of an obliquely deposited film. The corresponding contour plot is show in FIG. 5D with wavelengths of 2 nm, 4 nm, 6 nm, 8 nm and 10 nm. The plot clearly shows that anisotropy is still present at high resolutions and short (2 mn) wavelengths.

In order to permit direct comparison of uniformly deposited and obliquely deposit films, FIG. 6E shows the contour lengths for wavelengths of 8 nm. The uniform sample exhibits a contour length that is approximately the average of the orientation-dependent contour lengths of the obliquely deposited films.

In summary, the results above unambiguously establish the presence of structural anisotropy within the obliquely deposited films. The structural anisotropy is measured over distances on the surface corresponding to the grain size of the gold or smaller: the mean slope of the surface is greatest in the direction parallel to the direction of deposition of gold (by less than a couple of degrees).

Example 3

Whereas the analysis of contour lengths presented above permits identification of anisotropy within the surface in terms of the average slope of the surface (first spatial derivative), the anchoring of LCs on surface are influenced by the mean curvature of the surface (second spatial derivative) and not its local slope. Indeed it is possible to construct hypothetical surface profiles such that the RMS slope differs in orthogonal azimuthal directions yet the curvature is the same. A surface with different contour lengths in orthogonal directions but equal curvature values in both directions can be easily made from 2 orthogonal sine curves. If one direction is composed of a sinewave of an amplitude $A_0$ and a wavevector $q_0$, the corresponding contour length and curvature values are proportional to $A_0 q_0$ and $A_0 q_0^2$, respectively. If the curvature is kept constant then the orthogonal sinewave can be any new values of A and q that satisfies:

$$A_{new} q_{new}^2 = A_0 q_0^2 \tag{3}$$

The contour length will be different for any new values of the amplitude and wavevector that are different from the original values and which satisfy the previous equation.

The curvature of a surface can be directly tied into the elastic energy density (due to twist, splay and bend) of a LC placed on the surface by (De Gennes et al., THE PHYSICS OF LIQUID CRYSTALS; Oxford University Press, Oxford (1993)), $$F_d = \frac{1}{2} K_1 (div n)^2 + \frac{1}{2} K_2 (n \cdot curl n)^2 + \frac{1}{2} K_3 (n \times curl n)^2 \tag{4}$$

Each term in Equation 4 possesses a leading order term that is proportional to the curvature of the surface. Below it is demonstrated that gold films deposited obliquely possess anisotropic curvature (different values of curvature measured in orthogonal directions) and that scanning probe microscopy can be used to measure this anisotropic curvature.

3.1 Materials and Methods

The procedure used to extract the curvature from AFM images of the gold films was similar to that reported above for the contour analysis. First, a central point difference method (eq. 4) was used to calculate the square of the curvature as a function of wavelength and azimuthal direction at all points of the image (except near edges):

$$curv_{i,\lambda}^2 = \left[ \frac{z_{i+\lambda} - 2 \cdot z_i + z_{i-\lambda}}{\lambda^2} \right]^2 \tag{5}$$

The values of the curvature were then averaged for a given azimuthal scan direction, $$\overline{curv_\lambda^2} = \sum_i^n \frac{curv_{i,\lambda}^2}{n} \tag{6}$$

from which the RMS values of curvature were evaluated.

Results 3.2

FIG. 6 shows the mean square curvature of each image shown in FIG. 2. The sequence of presentation of the samples is the same as that used in FIG. 5. In short, the curvature of the surface of the obliquely deposited films is greatest in a direction parallel to the direction of deposition of gold on an obliquely deposited gold film (FIGS. 6A, 6B and 6D) whereas the uniformly deposited film of gold does not show evidence of a curvature that changes significantly with azimuthal orientation (FIG. 6C). In order to permit direct comparison of uniformly deposited and obliquely deposited films, FIG. 6E shows the curvatures for wavelengths of 8 nm. The uniformly deposited gold films exhibit RMS curvatures that are approximately the average of the orientation-dependent RMS curvatures of the obliquely deposited films. It is useful to note that the RMS curvatures reported in FIG. 6E range from ~0.018 to ~0.023 $nm^{-1}$, which corresponds to radii of curvature between ~55 and ~43 nm, repectively. These values are similar in magnitude to the grain size, which indicates that the shapes of the grains likely determine the anisotropic curvature.

The results of the curvature analysis described above confirm the existence of structural anisotropy within the obliquely deposited gold films of a type (curvature) that should influence the orientations of supported LCs. As discussed below, the magnitude of the curvature is indeed sufficient to account for azimuthal orientations of LCs observed in experimental measurements in twisted nematic LC cells.

Example 4

Example 4 provides a method for the estimation of an anchoring energy from the topography of obliquely deposited films of gold.

4.1 Materials and Methods

Several studies in the past have used the Berreman strain model (Berreman, D. W., *Phy. Rev. Lett.* 26: 28, 1683 (1972); Berreman, D. W., *Mol. Crys. & Liq. Crys.* 23: 215 (1973)) to estimate the elastic free energy density of a LC supported on a surface with sinusoidal roughness of one wavelength:

$$F = K/4 A^2 q^3 \quad (7)$$

This model contains a number of approximations, including the assumptions that (I) the director lies across the corrugations, (II) there exists no (local) azimuthal variations in the orientation of the LC, and (III) the elastic constants (splay and bend) of the LC are equal. The result above is useful for surfaces with a single mode of roughness. Obliquely deposited substrates, however, possess a spectrum of wavelengths and amplitudes of roughness.

By using a Fourier representation, an arbitrary surface was described as linear superposition of a family of sine waves:

$$z(x) = \sum_k A_k \sin(2\pi x q_k) \quad (8)$$

The elastic energy density from such a representation of a surface can be estimated as, $$F = \frac{K}{4} \sum_k A_k^2 \cdot q_k^3 \quad (9)$$

Although many different sets of $\{A_k, q_k\}$ can be used to represent a given surface profile, the elastic energy density is not necessarily the same for each set. This conclusion is supported by the observation that the profile of a single mode surface can be described by either a single sine function of amplitude A or by set of m sine functions with scaled amplitudes A/m. As the free energy density given by Equation 9 is not the same for both of the above-described representations of the surface, in a preferred embodiment, a multimode analysis such as that described by Berreman is utilized (Berreman, D. W., *Mol. Crys. & Liq. Crys.* 23: 215 (1973)).

The multimode analysis originally described by Berreman is presently thought to provide the best estimate of the anchoring energy of a LC on a rough surface (Berreman, D. W., *Mol. Crys. & Liq. Crys.* 23: 215 (1973)). This analysis includes the presence of crossed terms in the summation:

$$g = \frac{K_3}{2} \sum_j \sum_k A_j A_k q_j^2 q_k^2 \cdot \cos[x(q_j - q_k)] \cdot \exp[-(q_j + q_k) \cdot z] \quad (10)$$

where $A_j$ and $A_k$ are the amplitudes of the Fourier components, $q_j$ and $q_k$ are the associated wavevectors, x is the lateral position along the sine wave, z is the height from the surface, and $K_3$ is the bend elastic constant of the LC. This equation is based on the assumption that all elastic constants of the LC are approximately equal to $K_3$. Unlike the expression in Equation 9, any family of sinusoidal functions that accurately represents the profile of the surface will give the same free energy density when using Equation 10 (after averaging over all values of x and integrating from z=0 (the surface) to far from the surface).

The influence of the roughness of a surface on the elastic energy density of a supported LC was evaluated using Eq. 10 if the constraint $\lambda^2/A > L$ is satisfied. For the present experimental system, the surface of a typical grain size has a lateral dimension of ~20 nm and an amplitude (A) of 2 nm. Therefore, $\lambda^2/A$ was calculated to be 200 nm. This value is an order of magnitude large than the typical coherence length of a LC as 5CB (~1 5 nm). Therefore, that the free energy density of a LC supported on an obliquely deposited film of gold (of the type reported in this paper) can be described in terms of a elastic mechanism.

By combining Eq. 10 with the power spectrum in FIG. 7, the difference in the elastic free energy of a LC oriented parallel and perpendicular to the direction of deposition of the gold was evaluated as set forth in Equation 11:

$$\Delta F = |F_{90°} - F_{0°}| \quad (11)$$

4.2 Results

For nematic 5CB at room temperature ($K_3 = 10 \times 10^{-9}$ mN), an anchoring energy of ~0.015 mJ/m2, was calculated with the higher elastic energy corresponding to the orientation of the LC parallel to the direction of deposition of the gold. In Example 5, the calculated anchoring energy was compared to that measured using 5CB confined within a twisted cell formed with obliquely deposited substrates of gold.

Example 5

This Example provides a method for experimentally confirming the results obtained from the calculations performed in Example 4.

5.1 Materials and Methods

The orientations of LCs on SAMs assembled into optical cells were measured using the following procedure. Self-assembled monolayers were formed on the surfaces of gold films (~10 mm×~25 mm) by immersion of the films in ethanolic solutions containing 1 mM of propanethiol (for 2 hrs). Substrates were thoroughly rinsed with pure ethanol upon removal from the solutions used to form the SAMs. The samples were then dried by blowing a stream of $N_2$ across the surface of the slide. Each piece of gold film was then cut in half (~10 mm×~12 mm) and placed again under a stream of $N_2$ to displace any glass shards from the surface. Thin plastic spacers (thickness ~10 µm, Mylar or Saranwrap) were then laced along the edges of an upward-facing half of the sample. The second half of the sample was then placed, face-down, onto the spacers with an orientation such that the direction of deposition of the gold onto the second sample was orthogonal to the first half of the sample (as described below, this procedure leads to the formation of a twisted LC within the cell).

The optical cell was held together by "bulldog" clips placed along the edge of the sample. Both the optical cell and 5CB were then heated to ~40° C. by using a combination of a hot plate and air gun. At this temperature, 5CB was an isotropic liquid that readily filled the optical cell by capillarity. Once filled with 5CB, the optical cell was removed from the hot plate and allowed to cool slowly to room temperature.

The optical texture of the optical cell filled with LC was viewed under a polarized light microscope (in transmission mode). The direction of deposition of the gold on one of the surfaces of the optical cell was aligned with either the polarizer or analyzer of the microscope.

5.2 Results

The presence of ~90° twist deformation within the LC was inferred from the extinction of light with parallel polars and transmission of light with crossed polars. In contrast, the absence of twist was deduced by (I) transmission of light through parallel polars and extinction of light through crossed polars, and (II) strong modulation in the intensity of transmitted light (from light to dark) when the sample was rotated between crossed polars.

Within a twisted nematic LC cell (FIG. 8), the interactions of the LC with the confining surfaces must be sufficiently strong to support the formation of the twist deformation within the LC. The twist deformation within the LC can only be formed if the azimuthal anchoring energy exceeds a threshold. By using the azimuthal anchoring energy evaluated above, the minimum thickness L of a twisted nematic LC cell that can be formed under the influence of an azimuthal anchoring energy ΔF was estimated:

$$L = \frac{K_2}{2\Delta F}\left(\frac{\pi}{2}\right)^2 \qquad (12)$$

By using a twist elastic constant (Blinov et al., ELECTRO-OPTIC EFFECTS IN LIQUID CRYSTAL MATERIALS; Springer-Verlag: New York (1994)) of $6.4×10^{-9}$ mN and the value of ΔF evaluated in Example 5, the strength of the azimuthal anchoring energy was estimated to be sufficient to permit the formation of twisted cells as thin a 0.5 µm. As shown in FIG. 8, twisted nematic cells were formed with obliquely deposited films of gold using cells as thin as 1 µm.

Parts B and C of FIG. 8 show the optical textures formed by polarized light transmitted through an optical cell filled with nematic 5CB, with a thickness of approximately 1 µm. The dark image (FIG. 8C) is caused by the extinction of light when the cell is placed between parallel polars. The bright image (FIG. 8B) results from light transmitted through the cell and crossed polars. These optical characteristics indicate the presence of a twist deformation of 5CB within the cell, consistent with the prediction that the strength of azimuthal anchoring is sufficient to support twist within cells as thin as 0.5 µm. It was not possible to construct cells of thickness less than 1 µm. The glass slides vary in flatness by ~1 µm on lateral distances of a few centimeters, thus preventing the fabrication of cells having spacing of less than 1 µm. In addition, when the cell thickness is less than 1 µm, the nature of the elastic distortions in the LC is not well understood. See, Jerome, *Rep. Prog. Phys.* 54: 891 (1991).

Example 6

Example 6 provides a method utilizing AFM for measuring the changes in surface anisotropy and roughness of a gold film caused by adsorption of molecules onto the surface of the film.

6.1 Materials and Methods

Films of gold were obliquely deposited onto glass microscope slides as described in Example 1. Self-assembled monolayers were formed on the surface of these gold films by using a 1 mM ethanolic solution of hexadecanethiol and procedures described in Example 5. Atomic force microscopy was used to image the gold films (contact mode) before and after formation of the SAM by using methods described in Examples 3 and 4. The images of the gold films so-obtained were then analyzed to determine contour lengths and curvatures of cross-section profiles by using procedures also described in Examples 3 and 4.

6.2 Results

FIG. 2A shows a real space AFM image of an obliquely deposited film of gold prior to formation of a SAM on the surface of the film. FIG. 9A shows the real space AFM image of an obliquely deposited film of gold that supports a SAM formed from hexadecanethiol. FIGS. 5A and 9B show the results of contour length analyses of cross-sectional profiles taken from images of the gold films shown in FIGS. 2A and 9A, respectively. Two observations can be made from a comparison of these plots. First, the average length of a contour measured across the surface of the film of gold is reduced by adsorption of the SAM. For example, the average value of the contour length (sampling wavelength of 4 nm) is 1.07 nm/nm before adsorption of the SAM (FIG. 5A) and 1.05 nm/mn after adsorption of the SAM (FIG. 9B). Second, the anisotropy in the contour length is reduced by adsorption of the SAM on the surface of the film of gold. The anisotropy in contour length is 0.035 nm/nm for the bare gold film (FIG. 5A) and 0.02 nm/nm for the gold film supporting a SAM (FIG. 9B).

FIGS. 6A and 9C show the results of an analysis of the curvature of the cross sectional profiles, measured as a function of the azimuthal orientation of the cross-sectional profile before and after the formation of the SAM on the surface of the obliquely deposited film of gold. Two observations can be made from a comparison of these plot. First, the average value of the curvature of the bare gold film is 0.03 nm−1 (FIG. 6A), whereas this quantity is reduced to 0.02 $nm^{-1}$ by adsorption of the SAM (FIG. 9C). Second, the anisotropy in the curvature is reduced from 0.01 $nm^{-1}$ (FIG. 6A) to 0.005 $nm^{-1}$ by adsorption of the SAM (FIG. 9C).

Example 7

Example 7 provides a method utilizing AFM for predicting the response of LC placed on an obliquely deposited film of gold to a recognition event taking place on the surface of the gold film.

7.1 Materials and Methods

Films of gold were obliquely deposited onto glass microscope slides as described in Example 1. Atomic force microscopy was used to image the gold films (contact mode) by using methods described in Examples 3 and 4.

Self-assembled monolayers were formed on the surface of the gold films by either (i) immersion in 1 mM ethanolic solutions of $HS(CH_2)_{10}COOH$ for 2 hours (surface 1) or (ii) immersion in ethanolic solution containing 10 micromolar biotin-$(CH_2)_2[(CH_2)_2O]_2NHCO(CH_2)_{11}SH$ and 70 micromolar $CH_3(CH_2)_7SH$ for 8 hours (surface2).

Surface 1 was transformed into a surface presenting a sodium carboxylate salt by immersion into an aqueous solution at pH 11 (NaOH) for 10 mins. Upon withdrawal from the aqueous solution, excess solution on the surface was displaced using a nitrogen stream. The conversion of the acid to the salt was confirmed by using x-ray photoelectron spectroscopy.

Surface 2 was immersed into an aqueous solution containing 0.5 micromolar avidin (pH 7.4, 100 mM NaCl, 0.004% by volume Triton X-100). Upon withdrawal from the aqueous solution, excess solution of the surface was displaced by using a stream of nitrogen. The amount of avidin bound to the surface was determined by using ellipsometry.

The orientations of LCs were measured on surfaces of type 1 or type 2 by fabricating LC cells using the procedure described in Example 4.

7.2 Results

The real space image of the obliquely deposited film of gold is shown in FIG. 2A. A cross-sectional profile of the real space image in FIG. 2A is shown in FIG. 4. FIGS. 5 and 6 show the results of contour and curvature analyses of the cross sectional profiles of the image in FIG. 2A. Inspection of FIGS. 5 and 6 reveals that anisotropy within obliquely deposited films of gold can be measured on spatial scales of ~20 nanometers or less. When the wavelength used to sample the cross-sectional profile exceeds ~30 nanometers, neither the curvature nor the contour length change with the azimuthal angle of the cross sectional profile (i.e., anisotropy within the surface is not measured). Inspection of the cross-sectional profile in FIG. 4 demonstrates that roughness with a wavelength of ~20 nanometers has an amplitude of approximately 2 nanometers. Based on this AFM analysis, therefore, (i) a recognition event on the surface of the gold involving an analyte with a characteristic dimension of 2 nanometers (e.g., avidin, 4×4×5.6 nanometers) is predicted to significantly change the structure of the gold in a manner that will change the symmetry of the surface and thus be detected by a loss of uniformity in the anchoring of a liquid crystal; (ii) an event on the surface that changes the structure of the surface on a scale that is small compared to 2 nanometers (e.g., conversion of acid to a sodium salt) is predicted not to change the uniformity of anchoring of a LC on the surface.

These two predictions are verified by measurements of the orientations of LCs on surfaces of type 1 and 2. Whereas uniform optical textures were observed when LCs were supported on surfaces of type 1 before and after immersion into the aqueous solution of NaOH, a uniform optical texture was observed on a surface of type 2 only prior to immersion into the aqueous solution of avidin: following immersion and withdrawal from the aqueous solution of avidin, the optical texture of a LC was observed to be non-uniform on a surface of type 2. Ellipsometry revealed approximately 2.6 nanometers of avidin to be bound to the surface of type 2 (comparable to the amplitude of the roughness) whereas the ellipsometric thickness of the surface of type 1 changed by less than 0.2 nanometers upon immersion and withdrawal from the aqueous solution of NaOH.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method utilizing scanning probe microscopy for detecting anisotropy of a surface of an obliquely deposited metal film, said method comprising:
   (a) determining a first value representative of a contour length of a cross-sectional profile in a first direction of a scanning probe microscopic image of said metal surface;
   (b) determining a second value representative of a contour length of a cross-sectional profile in a second direction not parallel to said first direction of said scanning probe microscopic image of said metal surface;
   (c) comparing said first value and said second value;
   (d) determining said anisotropy on the basis of said comparison.

2. The method according to claim 1, wherein said scanning probe microscopy is a member selected from the group consisting of atomic force microscopy, scanning tunneling microscopy and combinations thereof.

3. The method according to claim 2, wherein said scanning probe microscopy is atomic force microscopy.

4. The method according to claim 1, wherein said metal film is from about 1 nanometer to about 200 nanometers thick.

5. The method according to claim 4, wherein said metal film is from about 5 nanometers to about 30 nanometers thick.

6. The method according to claim 1, wherein said metal film is produced by physical vapor deposition.

7. The method according to claim 1, wherein said surface further comprises an organic layer attached thereto.

8. The method according to claim 7, wherein said surface further comprises a recognition moiety attached to a member selected from the group consisting of said metal film, said organic layer and combinations thereof.

9. The method according to claim 1, wherein said surface further comprises a recognition moiety attached thereto.

10. The method according to claim 1, said comparing comprising, plotting a value representative of a contour length versus an azimuthal orientation of said contour length.

11. The method according to claim 1, said comparing comprising, converting said image into a matrix comprising M×N elements, wherein each of said elements represents a height ($z_i$) of a point on said metal surface.

12. The method of claim 11, further comprising,
    calculating the square of the distance between a first point on said surface with a height $z_i$ and second point on said surface with a height $z_{i+\lambda}$, wherein said first and second points are separated by a distance λ in a known azimuthal direction.

13. The method of claim 1, wherein said metal film is a member selected from the group consisting of gold film, silver film, copper film, nickel film, platinum film, palladium film and combinations thereof.

14. The method according to claim 13, wherein said film is a gold film.

15. A method utilizing scanning probe microscopy for detecting anisotropy of a surface of an obliquely deposited metal film, said method comprising:
   (a) determining a first value representative of a curvature of a cross-sectional profile in a first direction of a scanning probe microscopic image of said metal surface;
   (b) determining a second value representative of a curvature of a cross-sectional profile in a second direction not parallel to said first direction of said scanning probe microscopic image of said metal surface;
   (c) comparing said first value and said second value;
   (d) determining said anisotropy on the basis of said comparison.

16. The method according to claim 15, wherein said scanning probe microscopy is a member selected from the group consisting of atomic force microscopy, scanning probe microscopy and combinations thereof.

17. The method according to claim 16, wherein said scanning probe microscopy is atomic force microscopy.

18. The method according to claim 15, said comparing comprising,
   converting said image into a matrix comprising M×N elements, wherein each of said elements represents a height ($z_i$) of a point on said metal surface.

19. The method according to claim 18, further comprising,
   calculating the square of said curvature using a central point difference between a first point on said surface with a height $z_i$, a second point on said surface with a height $z_{i+\lambda}$ and a third point on said surface with a height $z_{i-\lambda}$, wherein said first, second and third points are separated by a distance $\lambda$ in a known azimuthal direction.

20. The method according to claim 15, wherein said surface further comprises an organic layer attached thereto.

21. The method according to claim 20, wherein said surface further comprises a recognition moiety attached to a member selected from the group consisting of said metal film, said organic layer and combinations thereof.

22. The method according to claim 15, wherein said surface further comprises a recognition moiety attached thereto.

23. A method utilizing scanning probe microscopy for detecting anisotropy of a surface of an obliquely deposited metal film, said method comprising:
   comparing a power spectrum for a scanning probe microscopic image of said surface obtained in first direction with a power spectrum for a scanning probe microscopic image of said surface obtained in second direction not parallel to the first direction, thereby detecting said anisotropy.

24. The method according to claim 23, wherein said scanning probe microscopy is a member selected from the group consisting of scanning tunneling microscopy, atomic force microscopy and combinations thereof.

25. The method according to claim 24, wherein said scanning probe microscopy is atomic force microscopy.

26. The method according to claim 23, wherein said metal film is from about 1 nanometer to about 200 nanometers thick.

27. The method according to claim 26, wherein said metal film is from about 5 nanometers to about 30 nanometers thick.

28. The method according to claim 23, wherein said surface further comprises an organic layer attached thereto.

29. The method according to claim 28, wherein said surface further comprises a recognition moiety attached to a member selected from the group consisting of said metal film, said organic layer and combinations thereof.

30. The method according to claim 23, wherein said surface further comprises a recognition moiety.

31. The method according to claim 23, wherein said metal film is a member selected from the group consisting of gold film, silver film, copper film, nickel film, platinum film, palladium film and combinations thereof.

32. The method according to claim 31, wherein said film is a gold film.

33. A method of selecting an anisotropic surface, said anisotropy causing said surface to respond in a detectable manner at a desired level of response to an analyte that interacts with said surface, said method comprising:
   (a) obtaining a first power spectrum in a first direction and a second power spectrum in a second direction not parallel to said first direction of one said surface having a first property and characterizing said anisotropy of said surface using said power spectrum; and
   (b) repeating step (a) at least once on surfaces having a second property, said property selected such that said anisotropy approaches a preselected value that will produce a desired level of response of said surface to said analyte, until said level is achieved.

34. The method according to claim 33, wherein said surface comprises a metal film obliquely deposited onto a substrate.

35. The method according to claim 34, wherein said surface comprises an organic layer.

36. The method according to claim 34, wherein said surface further comprises a recognition moiety.

37. The method according to claim 34, wherein said first and said second property are members independently selected from the group consisting of identity of said metal film, angle of depositing said metal film, rate of depositing said metal film, temperature of depositing said metal film, pressure of depositing said metal film, identity of said substrate and combinations thereof.

38. The method according to claim 37, wherein said metal film is a member selected from the group consisting of gold film, silver film, copper film, nickel film, platinum film, palladium film and combinations thereof.

39. The method according to claim 38, wherein said film is a gold film.

40. A method of selecting an anisotropic surface having recognition moieties thereon whose anisotropy causes said surface to respond in a manner detectable by scanning probe microscopy to an analyte that interacts with said recognition moieties at a desired level of response, said method comprising:
   (a) obtaining a first power spectrum in a first direction and a second power spectrum in a second direction not parallel to said first direction of one said surface in which said recognition moieties are present in a first density per unit area, said power spectra being obtained without analyte interacting with said recognition moieties;
   (b) obtaining a first power spectrum in a first direction and a second power spectrum in a second direction not parallel to said first direction of one said surface in which said recognition moieties are present in a first density per unit area, said power spectra being obtained with analyte interacting with said recognition moieties;

(c) comparing said spectra obtained with said analyte interacting with said recognition moiety and said spectra obtained without said analyte interacting with said recognition moiety to determine a difference therebetween that is representative of the degree of anisotropy of said surface.

41. The method of claim 40, further comprising, (d) repeating step (a)–(c) at least once on surfaces having densities of analyte recognition moieties per unit area that are different from said first density, said densities selected such that said difference successively approaches a preselected value that will produce a desired level response of said surface to said analyte, until said level is achieved.

42. The method according to claim 40, wherein said scanning probe microscopy is a member selected from the group consisting of scanning tunneling microscopy, atomic force microscopy and combinations thereof.

43. The method according to claim 42, wherein said scanning probe microscopy is atomic force microscopy.

44. The method according to claim 40, wherein said surface comprises a metal film obliquely deposited onto a substrate.

45. The method according to claim 44, wherein said metal film is from about 1 nanometer to about 200 nanometers thick.

46. The method according to claim 45, wherein said metal film is from about 5 nanometers to about 30 nanometers thick.

47. The method according to claim 44, wherein said metal film is a member selected from the group consisting of gold film, silver film, copper film, nickel film, platinum film, palladium film and combinations thereof.

48. The method according to claim 47, wherein said film is a gold film.

49. The method according to claim 44, wherein said surface further comprises an organic layer attached thereto.

50. The method according to claim 49, wherein said recognition moiety is attached to a member selected from the group consisting of said metal film, said organic layer and combinations thereof.

51. A method utilizing scanning probe microscopy for calculating the difference in elastic free energy between a liquid crystal anchored to an obliquely deposited metal surface in a direction parallel to a direction of metal deposition and a liquid crystal anchored to said surface in a direction perpendicular to said direction of metal deposition, said method comprising:

(a) obtaining amplitude and wavenumber data for an obliquely deposited metal surface from scanning probe microscopic data acquired in a direction parallel to said direction of metal deposition;

(b) calculating $F_0°$ utilizing said amplitude and wavenumber data for said direction parallel to said direction of metal deposition;

(c) obtaining amplitude and wavenumber data for an obliquely deposited metal surface from scanning probe microscopic data acquired in a direction perpendicular to said direction of metal deposition;

(d) calculating $F_0°$ said amplitude and wavenumber data for said direction perpendicular to said direction of metal deposition to calculate $F_{90}°$; and (e) calculating the difference between $F_{90}°$ and $F_0°$.

* * * * *